United States Patent [19]

Watanabe

[11] 4,093,919

[45] June 6, 1978

[54] CARRIER CONVERTER COMPRISING A VARIABLE IMPEDANCE CIRCUIT PAIR OR AT LEAST ONE BALANCED DIODE BRIDGE

[75] Inventor: Hiroshi Watanabe, Tokyo, Japan

[73] Assignee: Nippon Electric Co., Ltd., Tokyo, Japan

[21] Appl. No.: 714,921

[22] Filed: Aug. 16, 1976

[30] Foreign Application Priority Data

| Aug. 14, 1975 | Japan | 50-98853 |
| Aug. 14, 1975 | Japan | 50-98854 |
| Aug. 14, 1975 | Japan | 50-98855 |
| Aug. 14, 1975 | Japan | 50-98856 |
| Jan. 19, 1976 | Japan | 51-5269 |

[51] Int. Cl.$^2$ .............................................. H03C 1/50
[52] U.S. Cl. .................................... 325/316; 325/446; 325/461; 332/1
[58] Field of Search .......................... 325/9, 315–317, 325/103, 153, 430, 435, 431, 434, 438, 439, 442, 446, 449, 461, 7; 332/1

[56] References Cited

U.S. PATENT DOCUMENTS

| 2,528,187 | 10/1950 | Sziklai et al. | 332/1 |
| 3,348,168 | 10/1967 | Melchior et al. | 325/103 |
| 3,983,487 | 9/1976 | Ohno | 325/461 |
| 4,001,729 | 1/1977 | Weinberger | 325/316 |

Primary Examiner—Robert L. Griffin
Assistant Examiner—Marc E. Bookbinder
Attorney, Agent, or Firm—Sughrue, Rothwell, Mion, Zinn and Macpeak

[57] ABSTRACT

A carrier converter comprises a branching filter for dividing an FM signal into a pair of component signals having amplitudes varying in relation to the FM signal frequency in different frequency ranges. A directional coupler is coupled to a pair of variable impedance circuits. Supplied with the component signals together with a carrier signal, the variable impedance circuits produce, through the coupler, an AM signal of the carrier signal modulated substantially by a modulating signal for the FM signal. When a carrier converter comprises a balanced diode bridge as a variable impedance circuit, an input AM signal may be supplied directly to one pair of the bridge terminals with a carrier signal supplied to the other bridge terminal pair through a balanced-unbalanced converter, through which the bridge produces an output AM signal of the supplied carrier signal modulated substantially by a modulating signal for the input AM signal.

14 Claims, 105 Drawing Figures

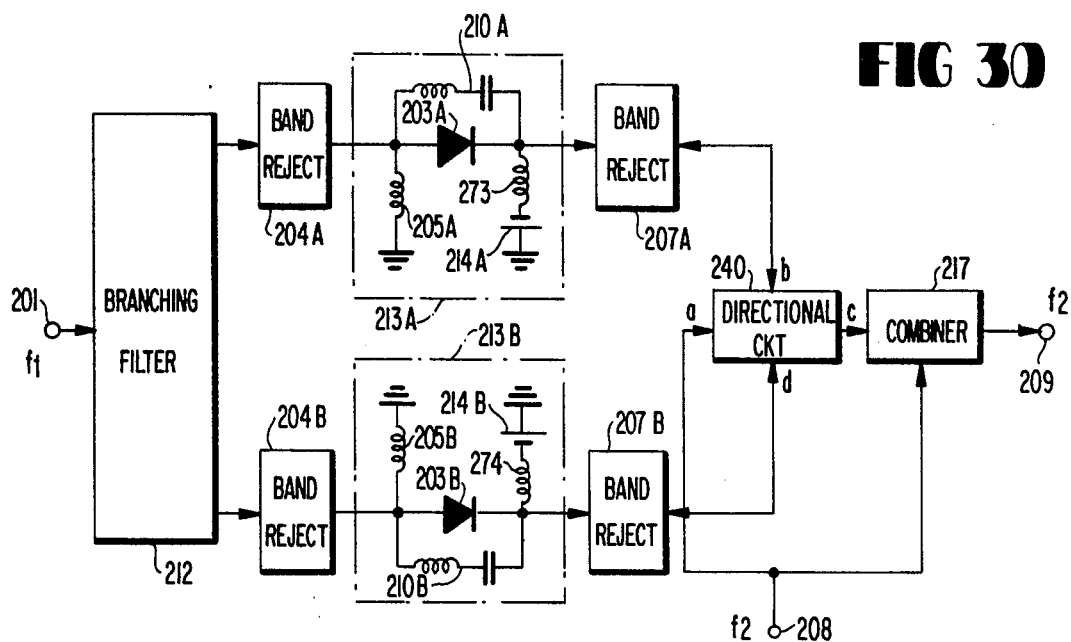

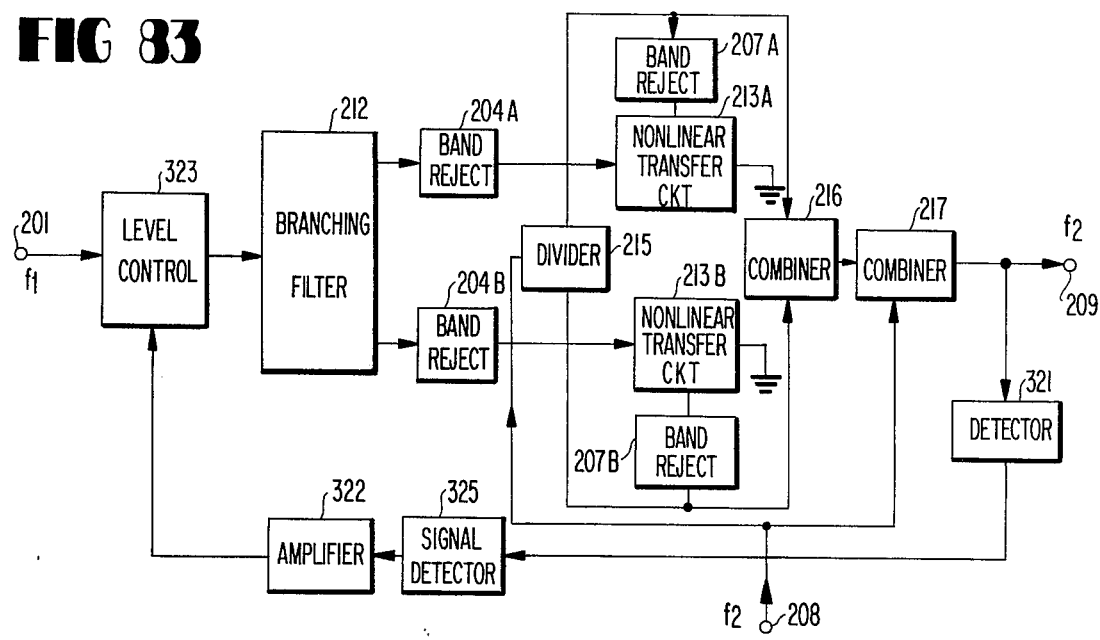
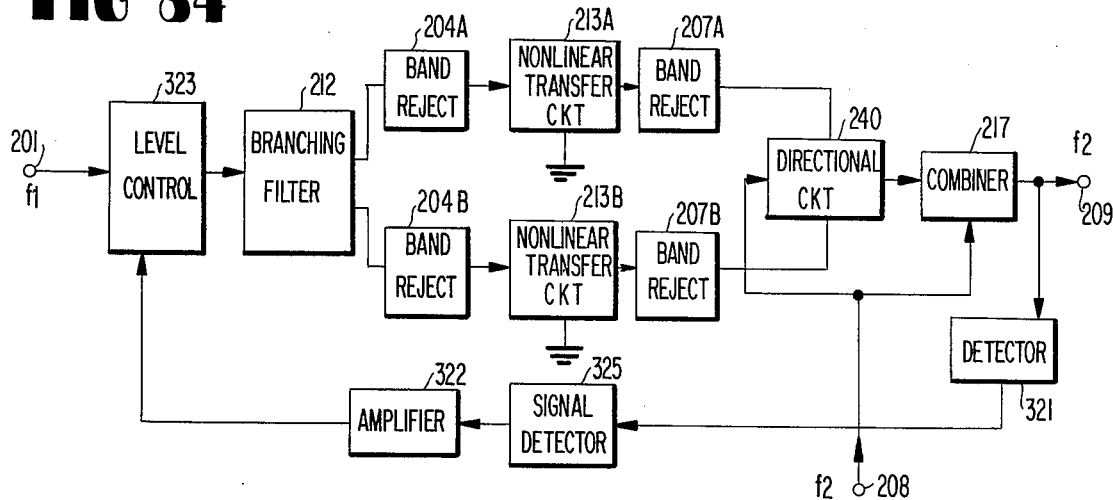
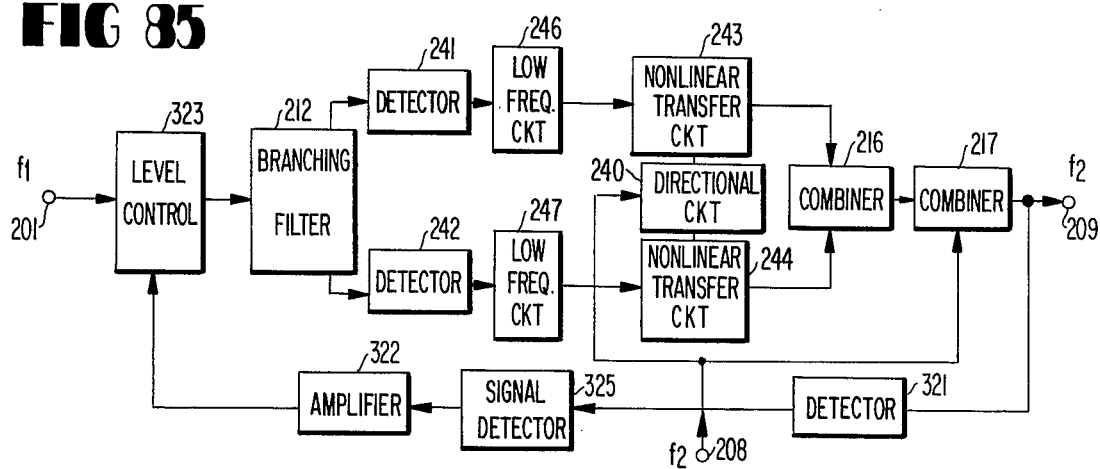

4,093,919

CARRIER CONVERTER COMPRISING A VARIABLE IMPEDANCE CIRCUIT PAIR OR AT LEAST ONE BALANCED DIODE BRIDGE

BACKGROUND OF THE INVENTION

This invention relates to a carrier converter, such as an FM-to-AM converter.

Various FM-to-AM converters are already in use for converting input FM (frequency modulated) signals directly to output AM (amplitude modulated) signals. A coventional FM-to-AM converter, however, has disadvantages as will later be described with reference to some figures of the accompanying drawing. For example, the carrier frequency of the output AM signal has to be selected in consideration of the frequency of the input FM signal. The amplitude of the AM signal has not been in excellent linear relation to the frequency shifts or deviations of the FM signal. Furthermore, the amplitude has been dependent on fluctuation in the amplitude of the FM signal so that use of an amplitude limiter of excellent performance has been indispensible in prior AM-FM converters. In a conventional FM-to-AM or AM-to-FM converters, it has been mandatory, although objectionable in view of FM-to-AM or AM-to-AM conversion characteristics of the carrier converter, to use rejection filters or traps on both input and output sides, respectively.

SUMMARY OF THE INVENTION

It is therefore a primary object of the present invention to provide an FM-to-AM converter wherein the amplitude of the output AM signal is in excellent linear relation to the frequency deviation of the input FM signal.

It is another primary object of this invention to provide an FM-to-AM converter whereby it is rendered unnecessary to use an amplitude limiter of excellent performance prior to the converter.

It is an additional primary object of this invention to provide an FM-to-AM converter wherefor it is possible to select the carrier frequency of the output AM signal independently of the input FM signal frequency.

It is a secondary object of this invention to provide a carrier converter which need not include traps on the input and output sides.

As will be illustrated hereunder with reference to some figures of the accompanying drawing, a conventional carrier converter for converting an FM signal derived by modulating a first carrier signal by a modulating signal to an AM signal derived by modulating a second carrier signal substantially by the modulating signal includes a first variable impedance circuit having a first impedance dependent on the amplitude of a first input signal, first means responsive to the FM signal for producing an output signal of an amplitude varying in relation to the frequency of the FM signal, second means responsive to the output and second carrier signals for supplying the output signals as the input signal to the variable impedance circuit, and third means operatively coupled to the variable impedance circuit for deriving the AM signal. In accordance with this invention, the carrier converter comprises a second variable impedance circuit having a second impedance dependent on the amplitude of a second input signal. The first means comprises a branching filter responsive to a single input signal of varying frequency for producing a first and a second component signal as the output signal. The first and second component signals have a first and a second amplitude varying in relation to the varying frequency in different frequency ranges. The first means further comprises fourth means responsive to the FM signal for supplying the signal input signal to the branching filter. It is to be noted here that the first components signal serves as the output signal supplied by the second means to the first variable impedance circuit together with the second carrier signal. The carrier converter further comprises fifth means responsive to the second component and second carrier signals for supplying the second input signal to the second variable impedance circuit. The third means is operatively coupled further to the second variable impedance circuit.

BRIEF DESCRIPTION OF THE DRAWINGS

FIGS. 26 thru 32 are block diagrams of FM-to-AM converters according to second through eighth embodiments of this invention;

FIGS. 81 thru 90 are block diagram of FM-to-AM converters according to thirty-sixth through forty-fifth embodiments of this invention;

DESCRIPTION OF THE PREFERRED EMBODIMENTS

Figure 1:
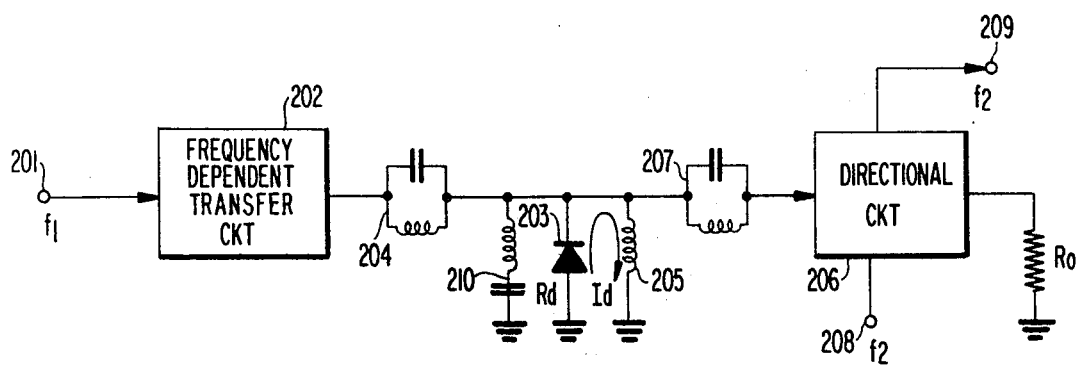
FIG. 1 is a block diagram of a conventional FM-to-AM converter.
Figure 2:
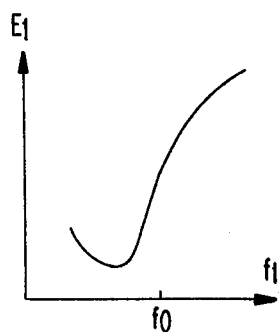
FIGS. 2 thru 4 show signals for describing the operation of the conventional FM-to-AM converter depicted in FIG. 1.
Figure 3:
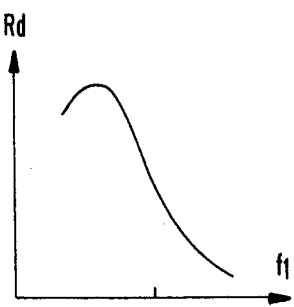
Figure 4:
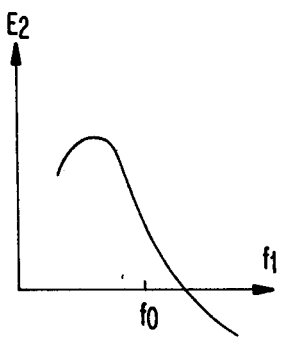

Referring to FIGS. 1 thru 4, a typical conventional FM-to-AM converter will be described at first to facilitate a better understanding of the present invention. The converter comprises an input terminal 201 for an input FM signal of an instantaneous frequency $f_1$ that varies on both sides of a center frequency $f_0$. An output AM signal has a carrier frequency $f_2$. The FM signal is supplied from the input terminal 201 to a frequency dependent transfer circuit 202 whose transfer characteristics are dependent on the frequency $f_1$ of the FM signal with a center of the characteristics set at the center frequency $f_0$. By way of example, the circuit 202 supplies an output signal of a frequency dependent amplitude $E_1$ shown in FIG. 2 to a diode 203 through a first trap filter 204 for blocking the carrier signal $f_2$. The diode 203 rectifies the output signal $E_1$ to make a rectified current $I_d$ flow through a closed circuit comprising the diode 203 and a low pass or band rejection circuit 205. Inasmuch as the current $I_d$ varies with the output signal amplitude $E_l$, a small-signal impedance $R_d$ of the diode 203 varies in a manner exemplified in FIG. 3. A directional circuit 206, such as a bridge circuit, a directional coupler, or a circulator, of a characteristic impedance $R_0$ is connected to the diode 203 through a second trap filter 207 for blocking the FM signal frequency $f_1$. When supplied with the carrier signal $f_2$ through an input port 208, the directional circuit 206 supplies the AM signal of an instantaneous amplitude $E_2$ shown in FIG. 4 to an output port 209 which serves also as an output terminal of the converter. The low pass or band rejection circuit 205 is for both frequencies $f_1$ and $f_2$. Inasmuch as the carrier signal $f_2$ is supplied also to the diode 203, the rectified current $I_d$ has current components of frequencies given by:

$$|mf_1 \pm nf_2|, \quad (1)$$

where $m$ and $n$ represent integers including zero provided that the component frequencies are not rendered equal to $f_1$ and $f_2$. A band pass trap 210 is therefore connected in parallel to the closed circuit so to short the most harmful one of the current components. The amplitude $E_2$ of the AM signal is determined by:

$$E_2 = k(R_d - R_0)/(R_d + R_0),$$

where $k$ represents a constant. It may be mentioned here that the diode 203, transfer circuit 202, connection between the transfer circuit 202 and diode 203 and connection between the input port 208 and diode 203, and directional circuit 206 correspond in the example described hereinabove to the first variable impedance circuit the first, second, and third means set forth in the preamble of the instant specification.

Further referring to FIGS. 1 thru 4, it is probable with an FM-to-AM converter that some of the current components of the frequencies given by Formula (1) would appear at the output terminal 209 superposed on the output AM signal as parasitic signals. It has therefore been difficult to optionally select the carrier frequency $f_2$. It has been impossible to achieve excellent linearities between the FM signal frequency $f_1$ and the output signal amplitude $E_1$, between the output signal amplitude $E_1$ and the small-signal impedance $R_d$, and between the small-signal impedance $R_d$ and the AM signal amplitude $E_2$. Accordingly, the converter has not had sufficient linearity. When the amplitude of the input FM signal is subject to fluctuation, the small-signal impedance $R_d$ accordingly varies to further superpose fluctuating noises on the output AM signal amplitude $E_2$. It has consequently been indispensable to place an amplitude limiter (not shown) of excellent performance prior to the converter. Furthermore, the first trap filter 204 for the carrier frequency $f_2$ has been indispensable because the output AM signal developed across the diode 203 otherwise reaches back to the transfer circuit 202 to appear at the input terminal 201 and to deteriorate the frequency characteristics of the output AM signal. Similarly, the second trap filter 207 for the FM signal frequency $f_1$ has been indispensable because the output signal $E_1$ applied across the diode 203 otherwise reaches the directional circuit 206 to appear superposed on the output AM signal and to deteriorate in effect the frequency characteristics of the output signal amplitude $E_1$. Inasmuch as the frequency band characteristics of the filters 204 and 207 are dependent on the quality factor Q of the resonance circuit, it is difficult to realize excellent rejection characteristics over a wide frequency band. If provided with excellent rejection characteristics over a considerably wide frequency range, filters 204 and 207 tend to reject the necessary frequencies to eventually deteriorate the baseband frequency and amplitude characteristics of the FM-to-AM conversion characteristics of the FM-to-AM converter. Moreover, adjustment of the filter 204 and 207 to the desired frequencies is troublesome.

Figure 5:
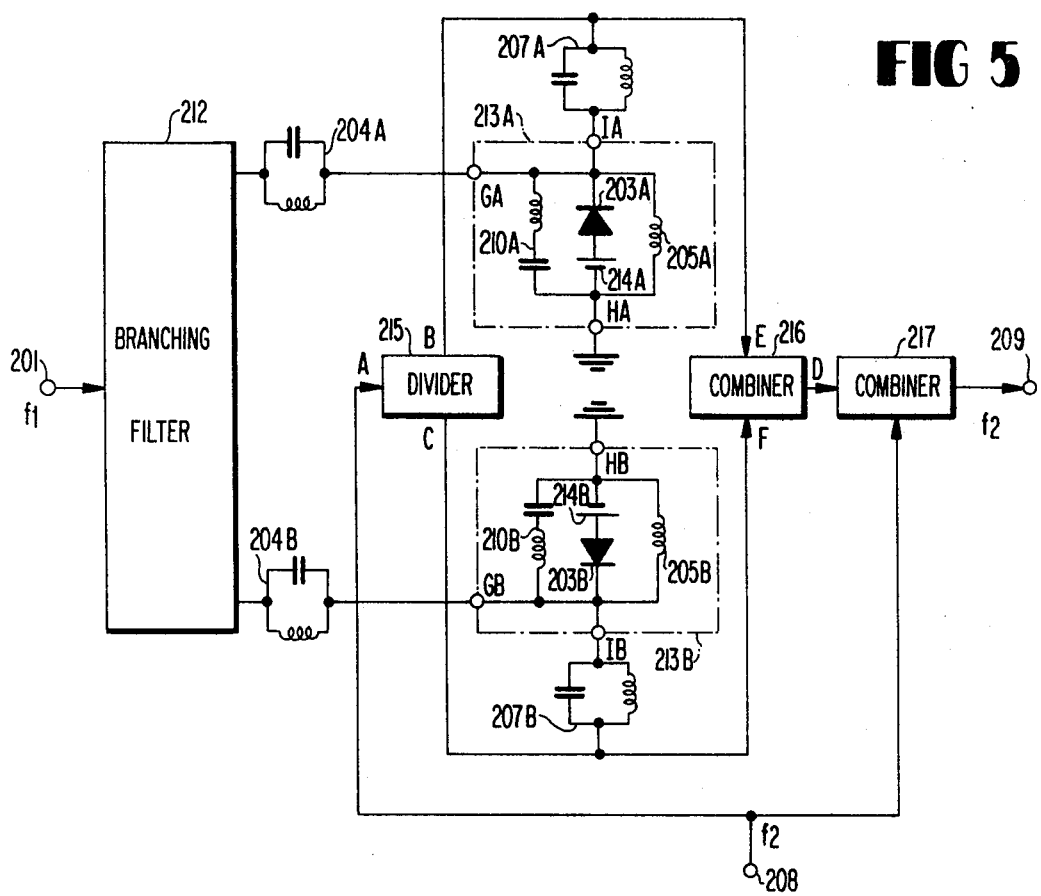
FIG. 5 is a block diagram of an FM-to-AM converter according to a first embodiment of the present invention.
Figure 6:
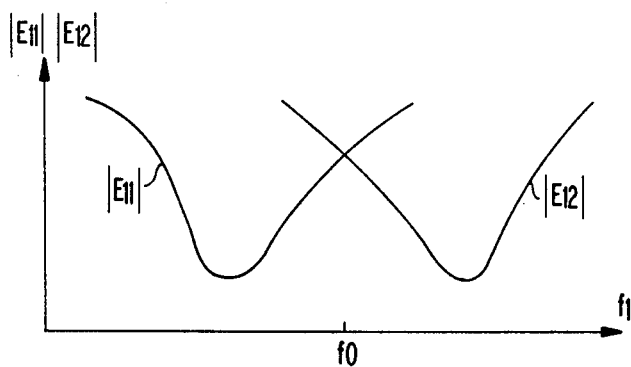
FIGS. 6 thru 11 show signals for describing the operation of an FM-to-AM converter according to the first embodiment.
Figure 7:
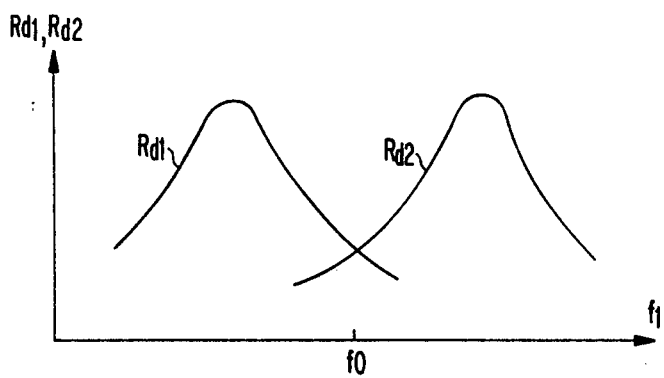
Figure 8:
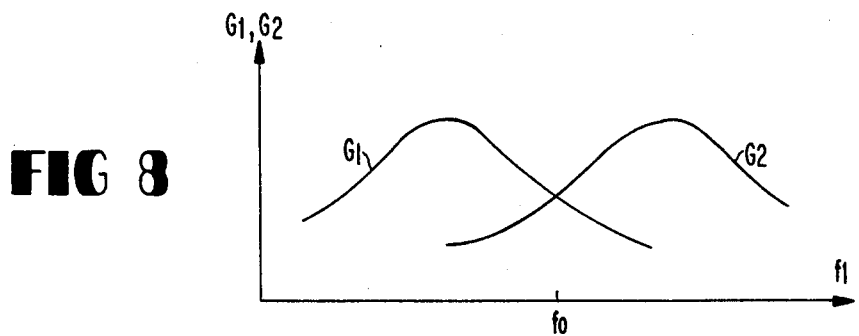
Figure 9:
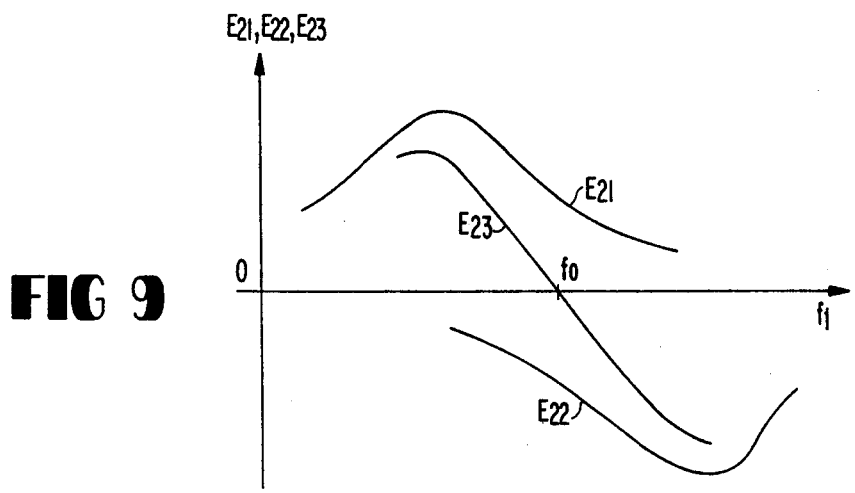

Referring now to FIG. 5, an FM-to AM converter according to a first embodiment of this invention comprises an input terminal 201, an input port 208, and a converter output terminal 209, all illustrated with reference to FIG. 1. Instead of a mere frequency dependent transfer circuit 202 described hereinabove, the converter comprises a branching filter 212 for dividing the input FM signal into a first and a second FM component signal according to the FM signal frequency $f_1$ as will be detailed later. The first component signal is supplied to a first terminal GA of a first variable impedance circuit 213A, depicted as a diode circuit, through a first trap filter 204A for the carrier $f_2$. The second component signal is similarly supplied to a first terminal GB of a second variable impedance circuit 213B through another first trap filter 204B for the carrier frequency $f_2$. The first variable impedance circuit 213A comprises a diode 203A, a low pass or band rejection circuit 205A, and a band pass trap 210A as in a conventional converter. The diode 203A is connected to a second terminal HA through a base source 214A on the one hand and to a second trap filter 207A for the FM signal frequency $f_1$ through a third terminal IA. The second variable impedance circuit 213B comprises similar elements 203B, 205B, 210B and 214B and has second and third terminals HB and IB, the latter being connected to another to another second trap filter 207B for the FM signal frequency $f_1$. In the example being illustrated, the second terminals HA and HB are grounded. The first terminals GA and GB are the same as the third terminals IA and IB. Each of the diodes 203A and 203B, similarly directed and supplied with both signals of the frequencies $f_1$ and $f_2$ thereacross, may be a PN junction diode, a Schottky barrier diode, a tunnel diode, a Gunn diode, or an IMPATT diode. Instead of a single directional circuit 206 mentioned in connection with FIG. 1, the converter according to this embodiment comprises a divider 215, a first combiner 216, and a second combiner 217, which may all be directional couplers. The input port 208 is for a first port A, serving as a single input port, of the divider 215 and one of the ports of the second combiner 217. The carrier signal $f_2$ is transferred by the divider 215 to a second and a third port B and C, serving as a first and a second output port, thereof. A first port D, serving as a single output port, of the first combiner 216 is connected to another of the second combiner ports. The second and third ports B and C of the divider 215 are connected directly to a second and a third port E and F, serving as a first and a second input port, of the first combiner 216 and coupled to each other through the second traps 207A and 207B and the variable impedance circuits 213A and 213B. Transfer characteristics of the divider and first combiner 215 and 216 are such that:

$$| (<AB + <ED) - (<AC + <FD) | = 180°, \quad (2)$$

where the angles AB, AC, ED, and FD represent phase angles of the signals derived through the ports B and C and through the port D with respect to the signals supplied to the port A and to the ports E and F, respectively. Equation (2) is satisfied, among others, when the phase angles AB, AC and ED are equal to 0° while the phase angle FD is equal to 180°. Such a divider and a combiner will be described later.

Figure 10:
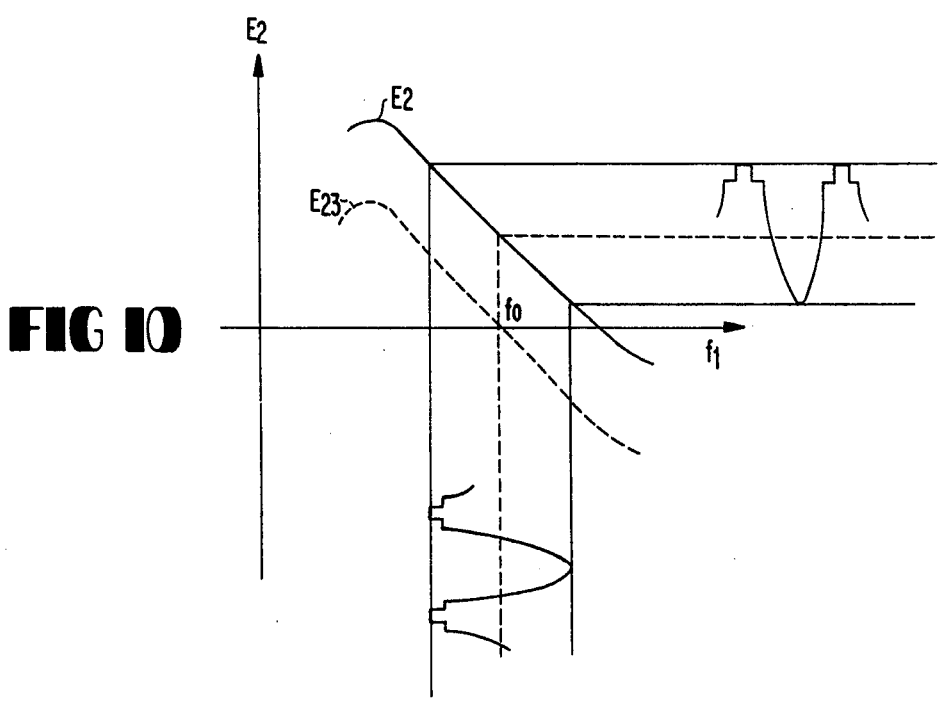
Figure 11:
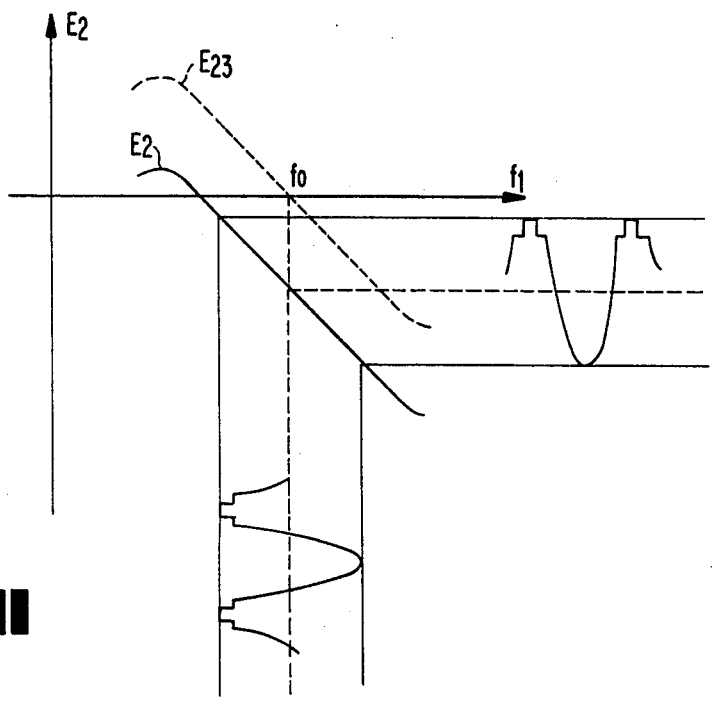
Figure 12:
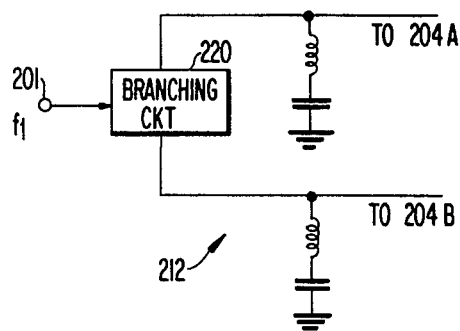
FIGS. 12 thru 17 show, partly in blocks, examples of a branching filter used in an FM-to-AM converter according to the first embodiment.
Figure 13:
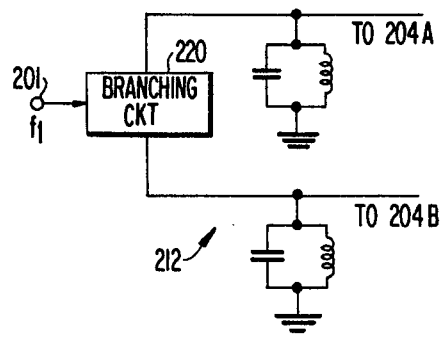
Figure 14:
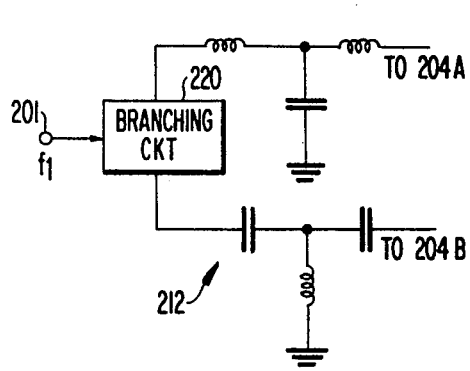

Referring again to FIG. 5 and afresh to FIGS. 6 thru 11, the first and second FM component signals have first and second amplitudes $E_{11}$ and $E_{12}$ substantially symmetrical with respect to the center frequency $f_0$. Small-signal impedances $R_{d1}$ and $R_{d2}$ of the diodes 203A and 203B and transfer characteristics $G_1$ and $G_2$ of the variable impedance circuits 213A and 213B for the carrier signal $f_2$ therefore vary substantially symmetrically with respect to the center frequency $f_0$. In compliance with changes in the transfer characteristics $G_1$ and $G_2$, first and second amplitudes $E_{21}$ and $E_{22}$ of a first and a second port input signal supplied to the first and second input ports E and F of the first combiner 216 vary again substantially symmetrically with respect to the center frequency $f_0$ and have phases. Amplitude $E_{23}$ of a composite or port output signal that appears at the signal output port D of the first combiner 216 becomes substantially zero at the center frequency $f_0$ and is approximately rectilinear, passing through a point representative of the center frequency $f_0$ on the axis for the FM signal frequency $f_1$. The linearity of the composite amplitude $E_{23}$ is remarkably excellent as compared with that "linearity" achieved by a conventional FM-to-AM converter which is approximately the same as the "linearity" of each of the port input signal amplitudes $E_{21}$ and $E_{22}$. The second combiner 217 is for superposing an optional amplitude $E_c$ of the carrier signal $f_2$ on the combined signal amplitude $E_{23}$ either in phase or in opposite phase with respect to one of the first and second port input signals $E_{21}$ and $E_{22}$ by interchanging the ports of the second combiner 217 so that the output AM signal has an amplitude $E_2$ which is the composite signal amplitude $E_{23}$ shifted by the optional amplitude $E_c$. It is therefore possible to render the amplitude $E_2$ of the output AM signal zero at an optional frequency among the FM signal frequency $f_1$ and thereby to convert the input FM signal to an AM signal of a sufficiently high modulation degree with appreciably excellent linearity. Being devoid of any fluctuation at the center frequency $f_0$, the output AM signal amplitude $E_2$ hardly fluctuates in a frequency range adjacent to the center frequency $f_0$ and is substantially immune to the fluctuation, if any, in the input FM signal amplitude. Furthermore, it is possible as shown in FIGS. 10 and 11 to convert an input FM signal, modulated by a video signal with the synchronizing signals negative-going in frequency, to either of output AM signals with outwardly and inwardly going synchronizing signals. Speaking generally, it is possible to render the polarity of the amplitude modulation optionally positive or negative. It is now understood that the second combiner 217 may be dispensed with when only that portion of the composite signal which has an amplitude $E_{23}$ either larger or smaller than that corresponding to the center frequency $f_0$ is necessary to carry out the high-degree amplitude modulation of the positive or negative polarity.

Figure 15:
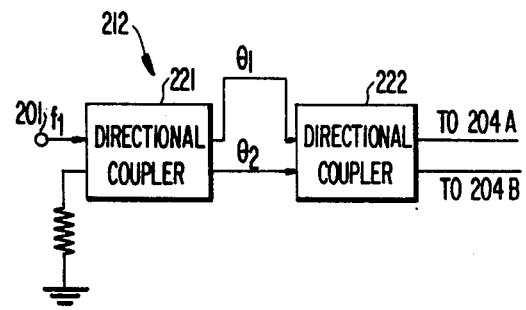
Figure 16:
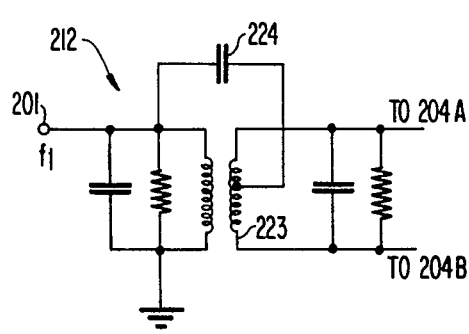
Figure 17:
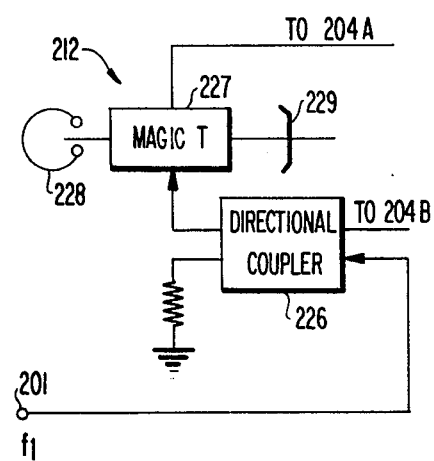
Figure 18:
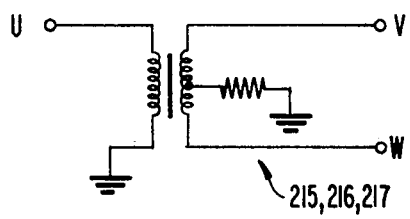
FIGS. 18 thru 25 show examples of a directional circuit used in an FM-to-AM converter according to the first embodiment.
Figure 19:
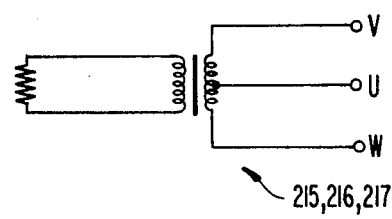
Figure 20:
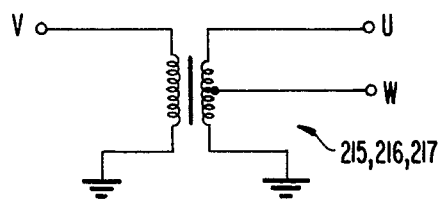

Referring to FIGS. 12 thru 17, a branching filter 212 comprises a branching circuit 220 for dividing the input FM signal into two substantially equal parts and a pair of series resonance circuits (FIG. 12), parallel resonance circuits (FIG. 13), or bandpass filters (not shown) for different frequency ranges within the input FM signal frequency $f_1$, or a low and a high pass filter (FIG. 14) for supplying the first and second FM component signals to the respective first trap filters 204A and 204B. Alternatively, the branching filter 212 comprises, as shown in FIG. 15, a first and a second directional coupler 221 and 222 cascaded through a pair of connections of different electrical lengths $\theta_1$ and $\theta_2$. According to an example depicted in FIG. 16, the branching filter 212 comprises a transformer 223 having a primary winding and a center tapped secondary winding and a capacitor 224 connected between one end of the primary winding and the center tap. According to FIG. 17, the branching filter 212 comprises a directional coupler 226 grounded through a resistor and connected to the input terminal 201, to one of the first trap filters 204B, and to a magic tee 227 which, in turn, is connected to a tuning circuit 228, to the other of the first trap filters 204A, and to a short plunger 229. In any one of the branching filters 212 exemplified herein, use may be made of amplifiers, isolators, or directional circuits directly posterior to the input terminal 201, directly prior to the first trap filters 204A and 204B, and/or between the circuit elements 220 and the resonance circuits of filters, between the elements 221 and 222, or between the elements 226 and 227.

Figure 25:
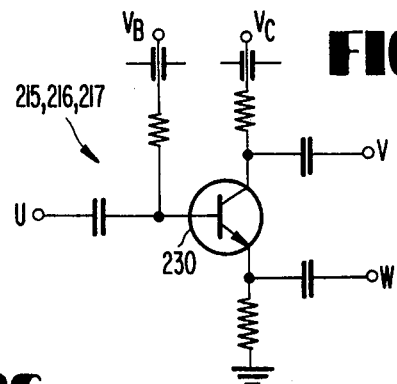

Referring to FIGS. 18 thru 25, each of the divider 215 and combiners 216 and 217 comprises a hybrid transformer (FIGS. 18 thru 22) with terminals U, V and W used as the ports A, B and C or the ports D, E and F, respectively. Alternatively, each divider and combiner may comprise a distributed constant circuit (FIG. 23) or an equivalent concentrated constant circuit (not shown). Each divider and combiner may comprise a T-branch (FIG. 24) of different electrical lengths $\phi_1$ and $\phi_2$. Again, each divider and combiner may comprise an active circuit element 230 (FIG. 25). Furthermore, it is possible to manufacture each of the divider 215 and combiners 216 and 217 with strip lines, wave guides, and other distributed constant circuits. In any one of the circuits illustrated with reference to FIGS. 18 thru 25, use may be made of an attenuator, an amplifier, or an isolator connected to each of a selected one or ones of the terminals U, V and W. Furthermore, it is possible to add a line of a suitable electrical length to each of one or more of the terminals U, V and W to make the divider 215 and first combiner 206 satisfy Equation (2).

Figure 26:
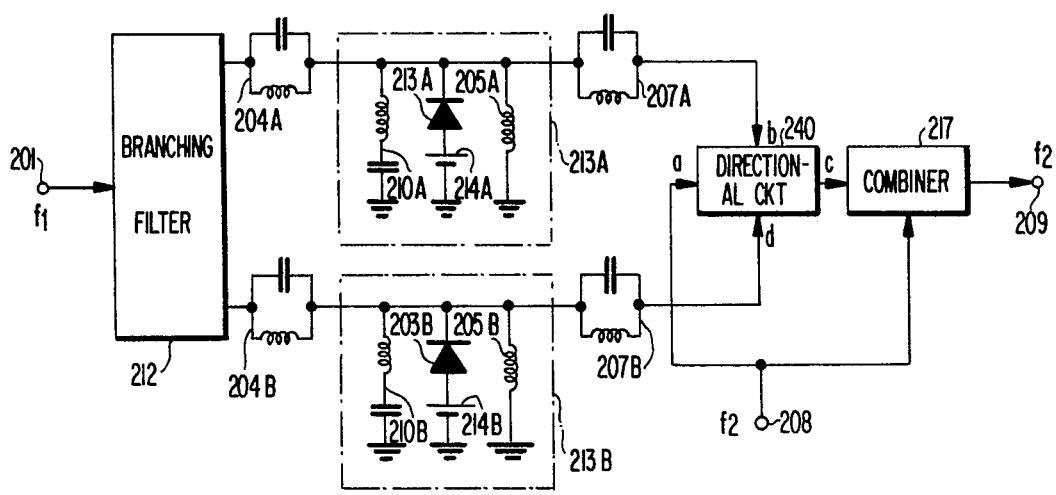

Referring now to FIG. 26, an FM-to-AM converter according to a second embodiment of this invention comprises similar elements designated by like reference numerals as in FIG. 5 except that a signal circuit 240, such as a bridge circuit or a directional coupler, having ports $a$, $b$, $c$ and $d$ is substituted for the divider 215 and the first combiner 216. The carrier signal $f_2$ is supplied to a port $a$ instead of the port A of the divider 215. The second trap filter 207A accompanying the first variable impedance circuit 213A is connected to the port $b$ rather than to the ports B and E of the divider 215 and combiner 216. Similarly, the other second trap filter 207B is connected to the port $c$. The port $d$ is connected to the single combiner 217. The carrier signal $f_2$ reflected by the diodes 203A and 203B have the amplitudes $E_{21}$ and $E_{22}$ exemplified in FIG. 9 when phase angles $ab$, $bc$, $cd$ and $da$ of the signals delivered from the ports $b$, $c$, $d$ and $a$ with respect to the signals supplied to the ports $a$, $b$, $c$, and $d$ are selected to satisfy:

$$| (<ad + <bc) - (<cd + <da) | = 180°,$$

such that, for example, the phase angles $ab$, $bc$ and $da$ are equal to 0° while the phase angle $cd$ is equal to 180°. The port $a$, which is the same as the input port 208, serves as a single input port for the carrier signal $f_2$. The ports $b$ and $d$ serve as first and second output ports for the carrier signal $f_2$ and as first and second input ports for AM component signals of the amplitudes $E_{21}$ and $E_{22}$. The port $c$ serves as a signal output port for a combined AM signal of the amplitude. The variable impedance circuits 213A and 213B serve as variable reflection circuits. It is possible with a converter according to this embodiment to achieve the technical merits described hereinabove with reference to FIGS. 9 thru 11.

Figure 27:
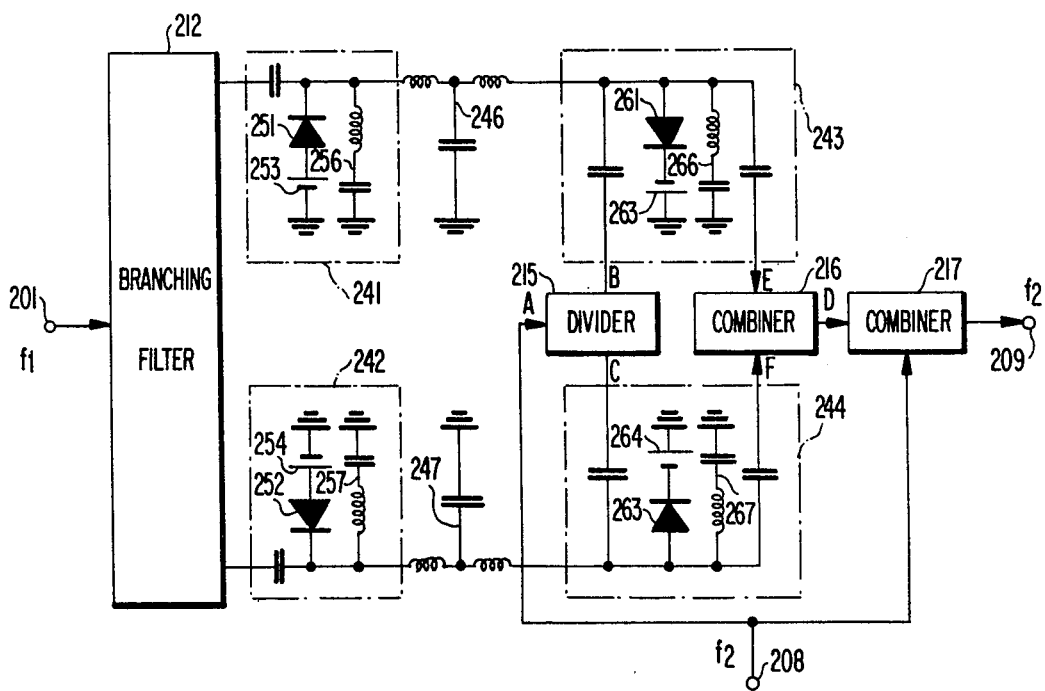

Referring to FIGS. 27, an FM-to-AM converter according to a third embodiment of this invention comprises an input terminal 201, an input port 208, an output terminal 209, a branching filter 212, a divider 215, and first and second combiners 216 and 217 as a converter according to the first embodiment. The present converter further comprises first and second detectors 241 and 242 shown as first and second diode circuits and connected directly to the branching filter 212 and first and second variable impedance circuits 243 and 244 depicted as third and fourth diode circuits and connected to the divider 215 and first combiner 216. The first and third diode circuits 241 and 243 are connected through a first low pass circuit 246. The second and fourth diode circuits 242 and 244 are connected through a second low pass circuit 247. The first and second diode circuits 241 and 242 comprise a pair of first diodes 251 and 252 connected to the branching filter 212 through capacitors directly to the low pass circuits 246 and 247, pias source 253 and 254 connected in series to the respective diodes 251 and 252, and filters 256 and 257 connected in parallel to the diodes 251 and 252 for shorting current components of frequencies $(m + 1)f_1$. The third and fourth diode circuits 243 and 244 comprise a pair of second diodes 261 and 262 connected to the divider 215 through capacitors, to the first combiner 216 also through capacitors, and directly to the low pass circuits 246 and 247, bias source 263 and 264 connected in series to the respective diodes 261 and 262, and filters 266 and 267 connected in parallel to the diodes 261 and 262 for shorting current components of frequencies $(n + 1)f_2$. The low pass circuits 246 and 247 serve like the low pass circuits 205A and 205B illustrated with reference to FIG. 5. The FM component signals of the amplitudes $E_{11}$ and $E_{12}$ exemplified in FIG. 6 produce variations in rectified or detected currents flowing through the first diodes 251 and 252 to vary, in turn, the bias currents for the second diodes 261 and 262 and thereby vary their small-signal impedances $R_{d1}$ and $R_{d2}$. When the divider 215 and first combiner 216 have the transfer characteristics given by Equation (2), it is obvious that the present converter provides the technical merits described hereinbefore with reference to FIGS. 9 thru 11. Furthermore, it is possible with this converter to select the carrier frequency $f_2$ of the output AM signal entirely without regard to the frequency $f_1$ of the input signal. This is because the signals supplied to the first diodes 251 and 252 are the respective FM component signals of the amplifiers $E_{11}$ and $E_{12}$ alone while those supplied to the second diodes 261 and 262 are only the carrier signals delivered from the ports B and C of the divider 215 and because no components of the frequencies given by Formula (1) are consequently delivered to the ports E and F of the combiner 216. Although the second diodes 261 and 262 may produce higher harmonics of the carrier frequency $f_2$, this is considerably avoided when the phase angles are selected to satisfy:

$$| <ED - <FD | = 180°, \qquad (3)$$

because these higher harmonics are supplied to the first combiner 216 with opposite phases. The condition of Equation (3) is satisfied by any one of the circuits illustrated with reference to FIGS. 18 thru 25, by the use of the additional line or lines if necessary.

Figure 28:
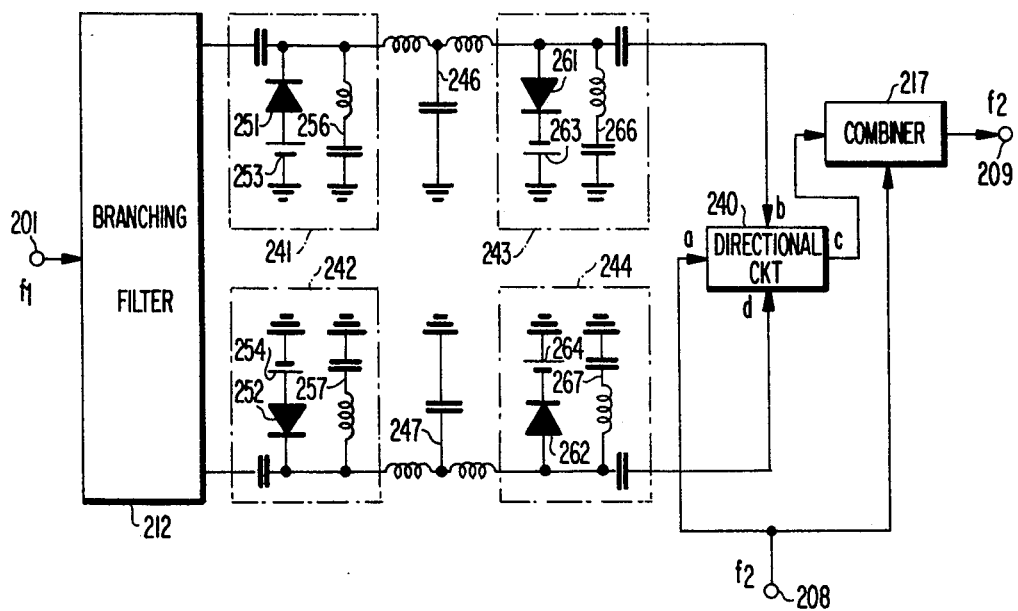

Referring to FIG. 28, an FM-to-AM converter according to the fourth embodiment of this invention comprises similar elements designated by like reference numerals as in FIG. 27 except that a directional circuit 240 is substituted for the divider 215 and first combiner 216. This converter provides all the merits described in conjunction with that according to the third embodiment. The higher harmonics are appreciably reduced when the phase angles $bc$ and $dc$ are selected with any one of the circuits exemplified with reference to FIGS. 18 thru 25 to satisfy:

$$| <bc - <dc | = 180°.$$

Figure 29:
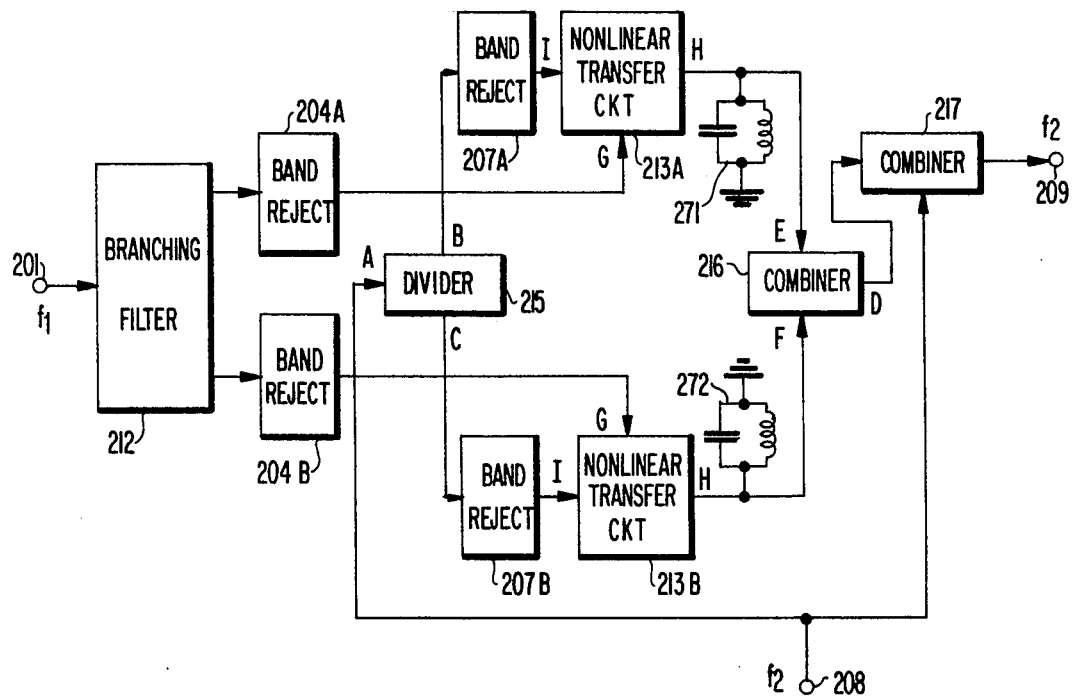

Turning to FIG. 29, an FM-to-AM converter according to a fifth embodiment of this invention comprises similar elements designated by like reference numerals as in FIG. 5 except that the first and second diode circuits 213A and 213B are connected in series as regards the carrier signal $f_2$ rather than in parallel. More particularly, the first combiner 216 is not connected to the second trap filters 207A and 207B but to the second terminals HA and HB through a pair of filters 271 and 272 for providing shorts for the currents of the input FM signal frequency $f_1$ which flow through the diodes 203A and 203B (FIG. 5). The filters 271 and 272 allow the carrier signal $f_2$ also to pass therethrough and may be either included in the first combiner 216 or completely dispensed with. In a modification of the fifth embodiment of this invention, it is possible to reverse the order of connection of the second trap filter 207A, diode circuit 213A, and filter 271 to the order of the filter 271, diode circuit 213A, and second trap filter 207A. It is also possible to carry out such a reversal of the order for the other second trap filter 207B, diode circuit 213B, and filter 272 or to reverse the both orders of connection.

Referring to FIG. 30, an FM-to-AM converter according to a sixth embodiment of this invention is similar to the second embodiment and differs from the latter in that the diodes 203A and 203B are connected in series rather than in parallel. The biases are supplied to the diode 203A and 203B through low pass circuits 273 and 274, respectively.

Figure 21:
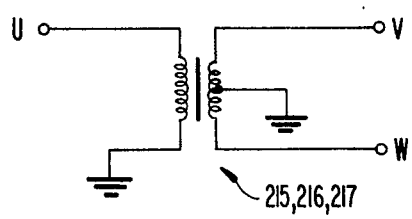
Figure 22:
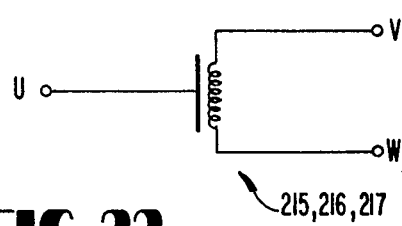
Figure 23:
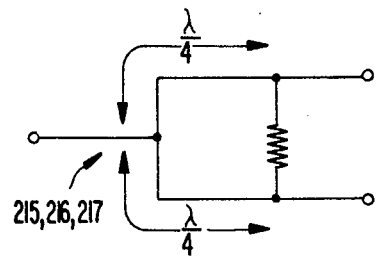
Figure 24:
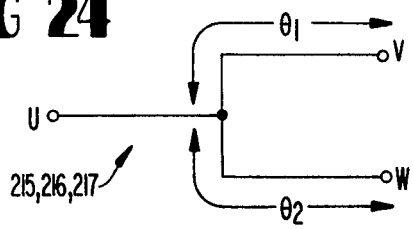

Referring to FIG. 21, an FM-to-AM converter according to a seventh embodiment of this invention is similar to the third embodiment and differs from the latter in that in that the diodes 251, 252, 261 and 262 are connected in series. The biases are supplied to the diodes 251, 252, 261 and 262 through low pass circuits 276, 277, 278 and 279.

Figure 32:
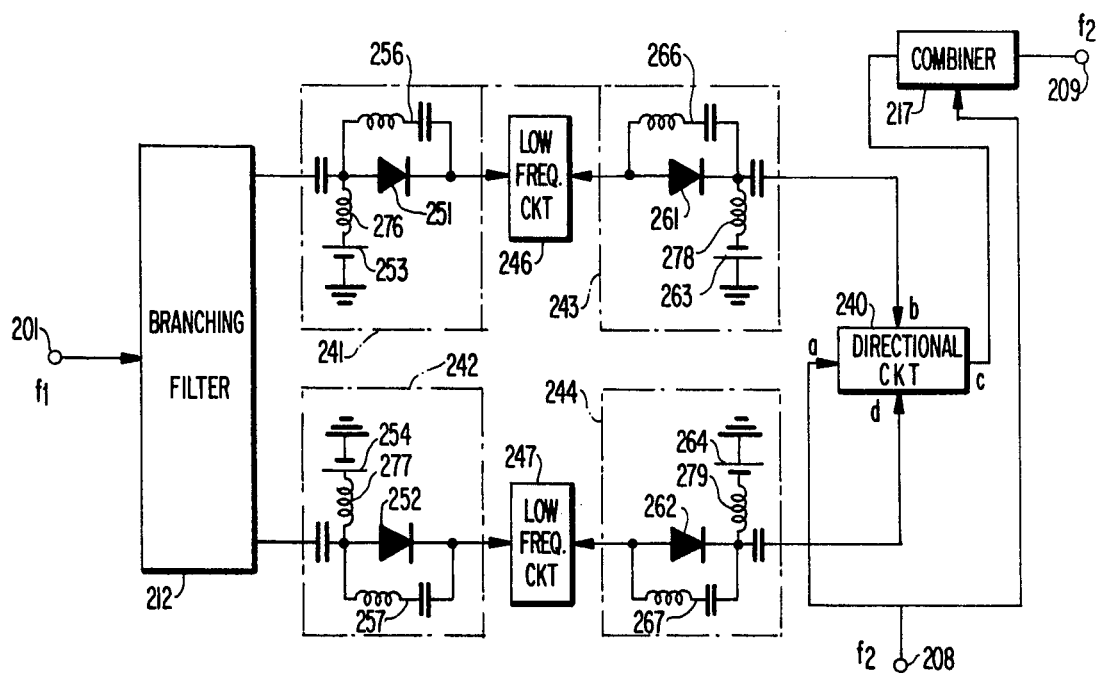

Referring to FIG. 32, an FM-to-AM converter according to an eighth embodiment of this invention is similar to the fourth embodiment and differs from the latter in that the diodes 251, 252, 261 and 262 are again connected in series. The biases are supplied to the respective diodes through low pass circuits 276, 277, 278 and 279 in FIG. 31.

It should be mentioned here that the embodiments described heretofore may be modified by reversing the polarity of the diode 203A and/or 203B and of the diode set 251 and 261 and/or 252 and 262. In further modification, use may be made, instead of the diodes, of any other non-linear active circuit elements. For example, use may be made of diode characteristics of transistors or electronic valves.

Figure 33:
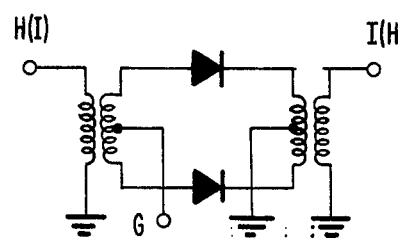
FIGS. 33 thru 51 show, partly in blocks, various examples of a variable impedance circuit for use in an FM-to-AM converter according to a modification of any one of the first through eighth embodiments.
Figure 34:
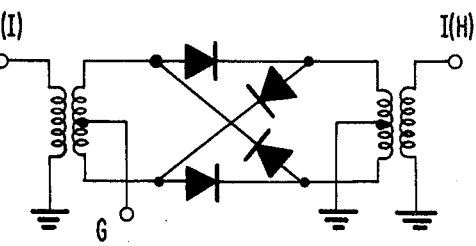
Figure 35:
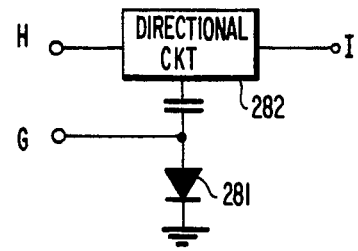

Turning now to FIGS. 33 thru 35, each of the diode circuits 213A and 213B may be a balanced circuit comprising a pair of diodes, a double balanced circuit comprising two pairs of diodes, or a combination of a diode 281 and a directional circuit 282, such as a bridge circuit, a directional coupler, or a circulator, with terminals used as the terminals G, H and I as indicated. In the last example, a change in the small-signal impedance of the diode 281 results in a consequent change in the reflection co-efficient of the illustrated circuit. Use may also be made in the circuits depicated in any one of FIGS. 33 thru 35 of a low pass circuit 205A or 205B, a trap circuit 210A or 210B, and/or a bias source 214A or 214B.

Figure 36:
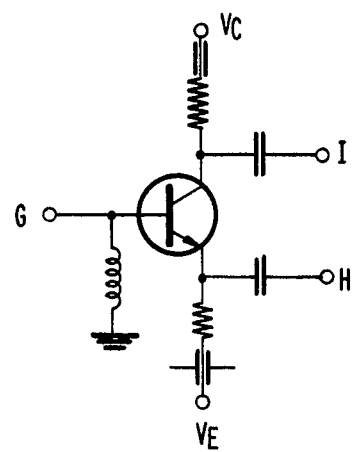
Figure 37:
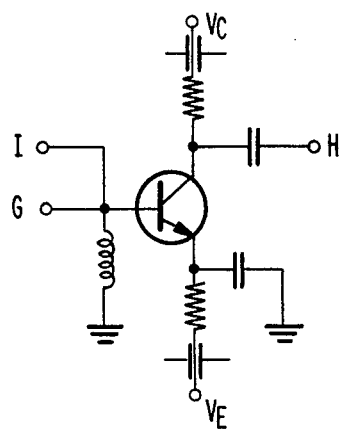

Referring to FIGS. 36 and 37, each of the diode circuits 213A and 213B may be a transistor amplifier with terminals used as the terminals G, H and I as labelled. When the FM component signal is supplied to the terminal G with the amplitude $E_{11}$ or $E_{12}$ varying as exemplified in FIG. 6, the wave form thereof is subjected to distortion both at the input and output ends. As a result, d.c. components are produced in the input and output signals. Being dependent on the amplitude $E_{11}$ or $E_{12}$, the d.c. components vary the working point of the transistor amplifier to change the small-signal input to output impedance. With the working point of transistor amplifier and the characteristics of branching filter 212 suitably set, it is possible to make the small-signal impedance, namely, the small-signal collector-emitter impedance in the circuit depicted in FIG. 36, vary in the manner exemplified in FIG. 7. It is possible to use the amplifier terminals shown in FIG. 36 in any other combination of the terminals G, H and I. As for the circuit illustrated in FIG. 37, any one of the transistor electrodes may be grounded with a pair of terminals G and I coupled to any one of the ungrounded transistor electrodes. Use may be made either of a field effect transistor or an electronic valve instead of the transistor exemplified in FIGS. 36 or 37. Use may additionally be made of a low pass circuit 205A or 205B and/or of a trap circuit 210A or 210B.

Figure 38:
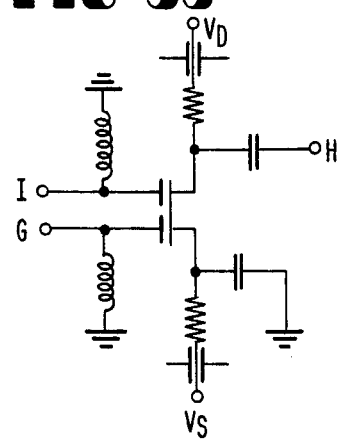

Referring to FIG. 38, a transistor amplifier for use in place of either of those illustrated with reference to FIGS. 36 and 37 comprises a dual-gate field effect transistor. The FM component signal is supplied to any one of the gates while the carrier signal $f_2$ is supplied to the other.

Figure 39:
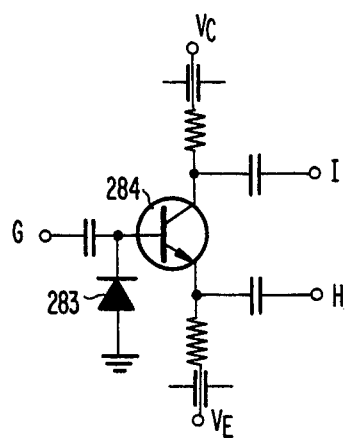
Figure 40:
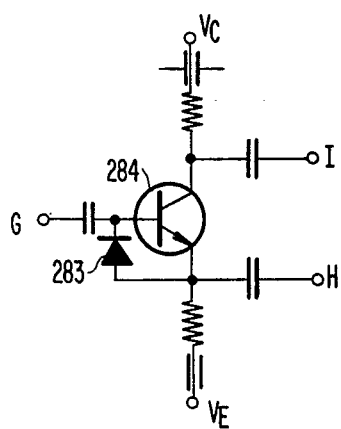
Figure 41:
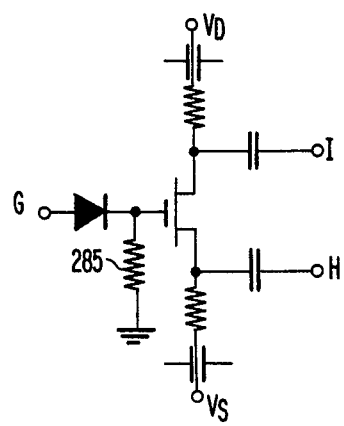

Referring to FIGS. 39 thru 41, it will readily be understood that a combination of a diode 283 and a transistor 284 may be used instead of a single transistor depicted in FIG. 36 or 37. The diode 283 may be connected to any other transistor electrode and in series to the transistor 284. As shown in FIG. 41, a resistor 285 or any other circuit element may be connected in parallel or series to the connection between the diode 283 and transistor 284. It is possible to substitute an electronic valve for the transistor.

It should be mentioned here in connection with the amplifiers illustrated with reference to FIGS. 36 and 37, that use may be made of two or more transistors or valves instead of one. As for the circuits described in conjunction with FIGS. 36 thru 41, a radio-frequency transformer may be substituted for a blocking capacitor.

Figure 42:
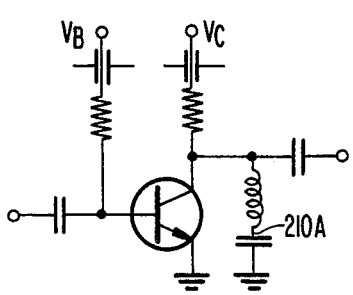
Figure 43:
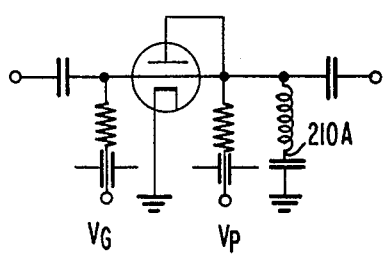

Referring to FIGS. 42 and 43, each of the diode circuits 213A and 213B may be a nonlinear circuit, such as shown therein. The trap circuit 210A or 210B is also depicated.

Figure 44:
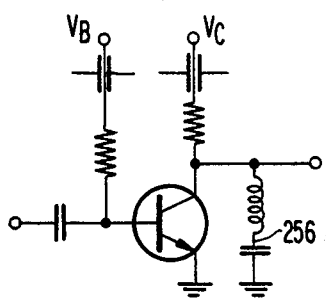
Figure 45:
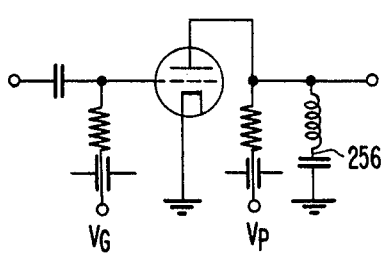

Turning to FIGS. 44 and 45, each of the first and second detectors 241 and 242 may be a nonlinear transistor or vacuum tube amplifier in which each of the FM component signals is subjected to distortion so that each of the input and output signals of the amplifier may contain a d.c. current component. Inasmuch as the FM component signal has a varying amplitude $E_{11}$ or $E_{12}$, the d.c. component accordingly varies to make the amplifier produce a detection current.

It is to be noted here in conjunction with the detectors 241 and 242 that use may be made of any one of the rectifier circuits described hereinabove which comprise two or more diodes. Also, the detector 241 or 242 may be a non-linear semiconductor circuit comprising a bipolar transistor, a field effect transistor, or an IMPATT diode, or a non-linear vacuum tube circuit.

Figure 46:
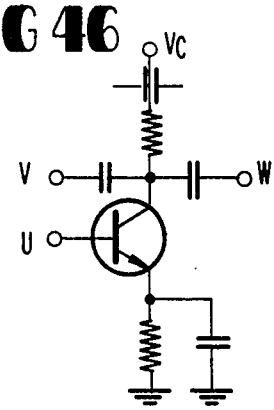
Figure 47:
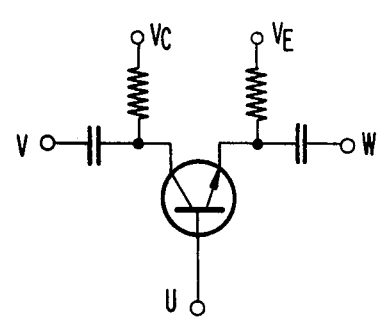
Figure 48:
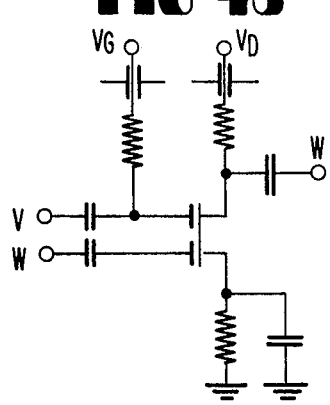

Turning to FIGS. 46 thru 48, each of the variable impedance circuits or transfer (FIG. 27) or reflection (FIG. 28) circuits 243 and 244 may be either a transistor circuit comprising a bipolar or a field effect transistor or an electronic valve circuit wherein the admittance of the active circuit element varies with the bias current or voltage. In FIGS. 46 thru 48, terminals U, V and W correspond to terminals G for the detector output signal, H for the supplied carrier signal $f_2$, and I for the AM component signal as indicated in FIG. 27. In an example illustrated in FIG. 46, use is made of the bias dependency of the collector to emitter admittance. In FIG. 47, the transistor is connected in series instead of parallel. In each of FIGS. 45 and 46, the terminals V and W may be interchanged. In FIG. 48, a detector output signal is supplied to one gate of a dual-gate field effect transistor while the carrier signal $f_2$ is supplied to the other gate.

Figure 49:
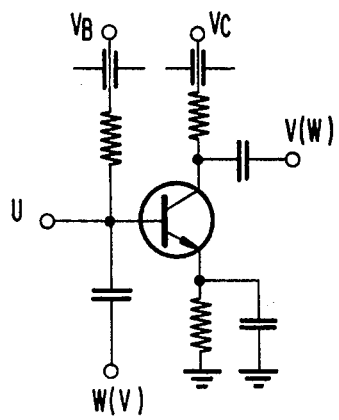
Figure 50:
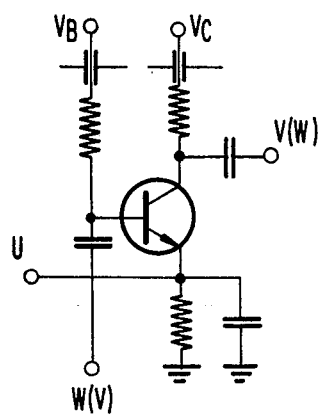
Figure 51:
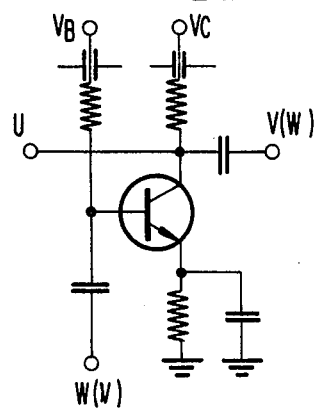

Referring to FIGS. 49 thru 51, each of the variable impedance circuits 243 and 244 may be a transistor amplifier having terminals U, V and W. In an example shown in FIG. 49, the detector output signal controls the base bias to accordingly vary the gain, namely, the transfer characteristics for the carrier signal $f_2$, between the base and collector. In FIG. 50 and 51, the detector output signal is supplied to the emitter and to the collector, respectively. It is possible to use the transistor either with the base or collector grounded. The non-linear active circuit element may be a bipolar transistor, a field effect transistor, or an electronic valve wherein either the forward or the backward gain varies with a change in the bias therefor.

It is pointed out here as regards the variable impedance circuits 243 and 244 that each of the diodes 261 and 262 may be a PIN diode. The variable impedance circuit 243 or 244 may be the circuit already illustrated with reference to FIGS. 33 thru 35 wherein use may further be made, as the diode 281, or a PIN diode, an IMPATT diode, or a Gunn diode of which the admittance varies with the current flowing therethrough.

In FIGS. 33 thru 51, use may be made either of a radio-frequency transformer or a blocking capacitor. If there is a difference in phase between the transfer characteristics of the variable impedance circuit pair 213A and 213B or 243 and 244, the divider 215, the first combiner 216, or directional circuit 240 should be provided with phase characteristics for compensating the difference.

Figure 52:
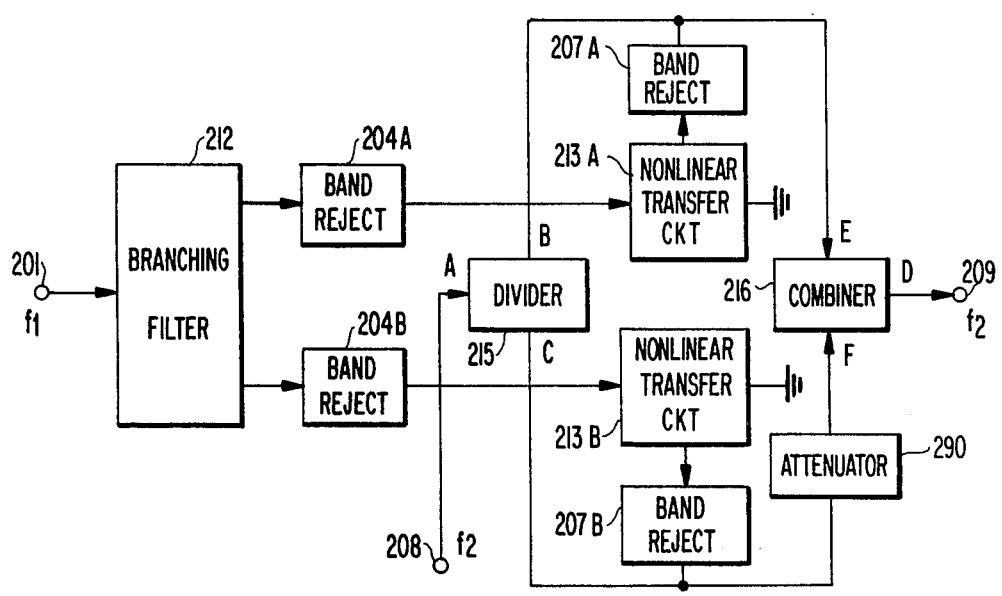
FIG. 52 is a block diagram of an FM-to-AM converter according to a ninth embodiment of this invention.
Figure 53:
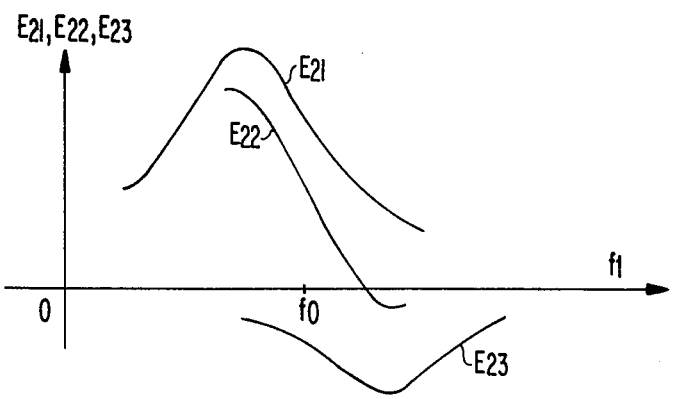
FIG. 53 shows signals for describing the operation of an FM-to-AM converter according to the ninth embodiment.

Referring now to FIGS. 52 and 53, an FM-to-AM converter according to a ninth embodiment of this invention comprises similar elements designated by like reference numerals as in FIG. 5. The second combiner 217, however, is omitted. Instead, use is made of an attenuator 290 between one of the diode circuits 213B and the relevant port of the single combiner 216. This renders the corresponding AM component signal amplitude $E_{22}$ attenuated (FIG. 53) so that the composite AM signal amplitude $E_{23}$ may become zero at a point different from the center frequency $f_0$ and that the output AM signal may have a desired amplitude at the center frequency $f_0$ with the branching filter 212 designed accordingly. Although the converter circuit is somewhat unbalanced by the attenuator 290, the linearity is yet better than that of a conventional converter. It is now possible to achieve the characteristics depicting in FIG. 53 by rendering, instead of using either a second combiner 217 or an attenuator 290, the FM component signal amplitudes $E_{11}$ and $E_{12}$ different to thereby make the small-signal impedances $R_{d1}$ and $R_{d2}$ of the diode circuits 213A and 213B different.

Figure 54:
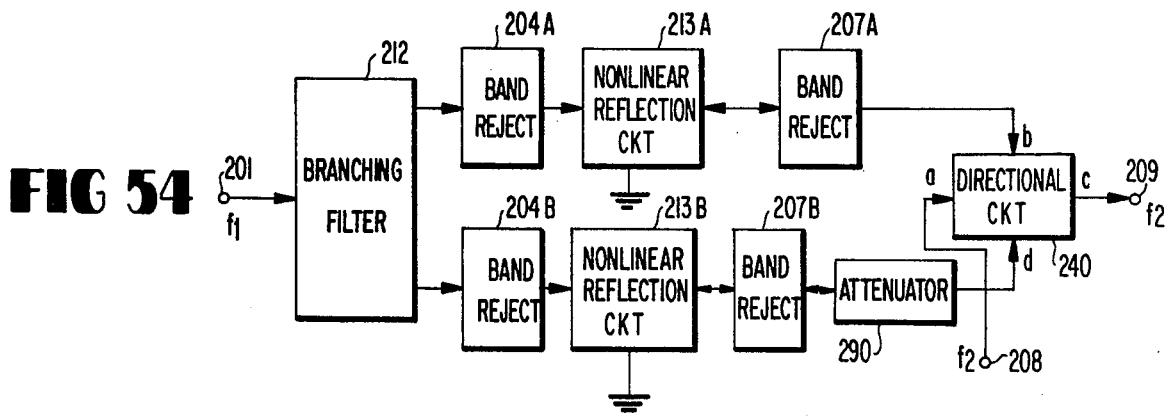
FIGS. 54 thru 75 are block diagrams of FM-to-AM converters according to tenth through thirty-first embodiments of this invention.
Figure 55:
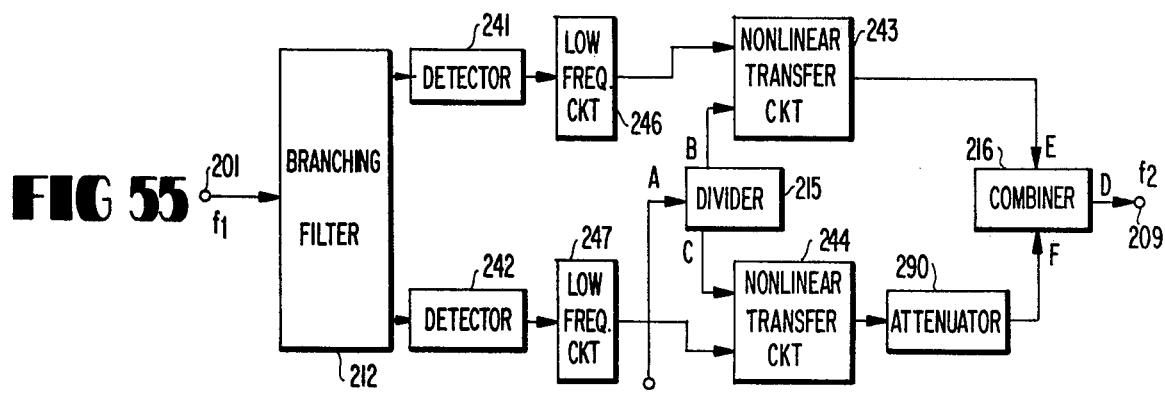
Figure 56:
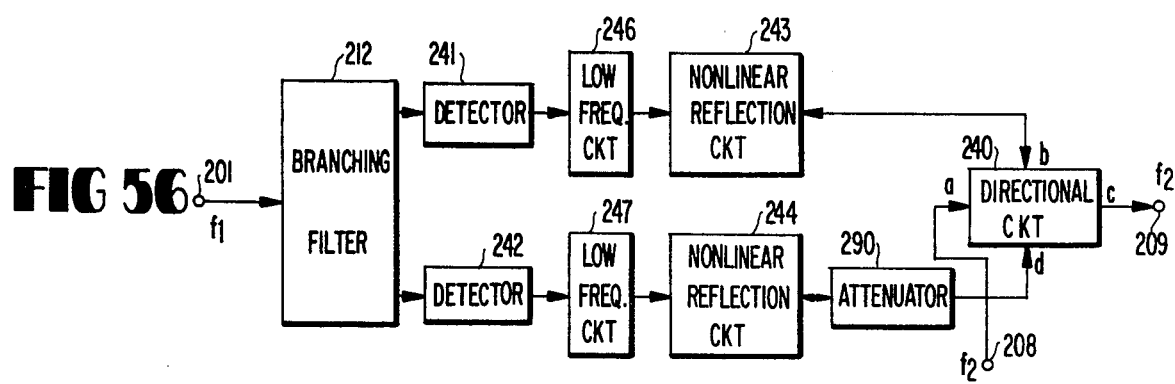
Figure 57:
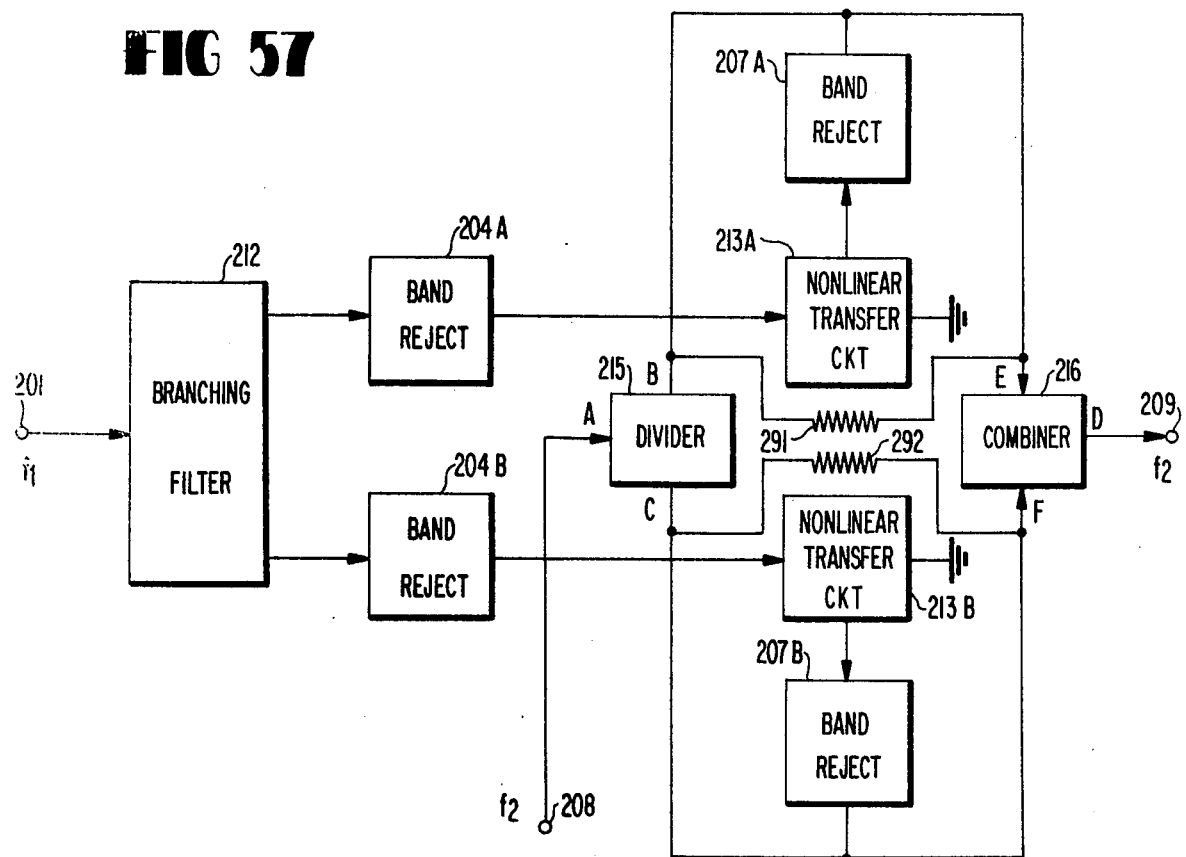
Figure 58:
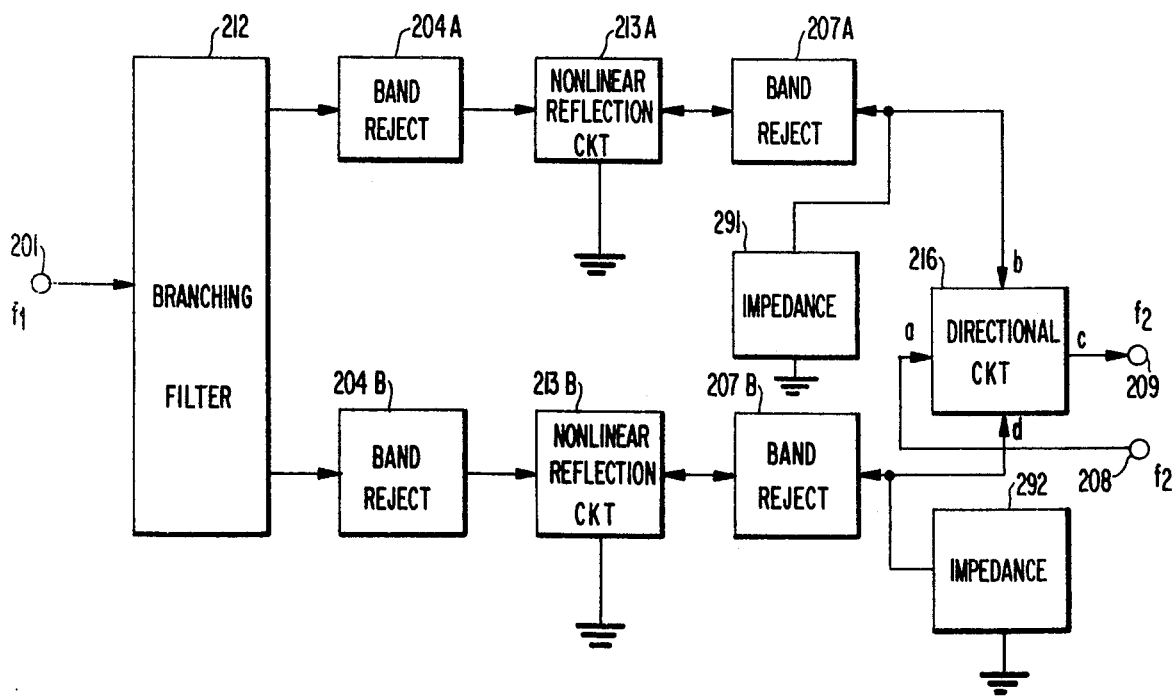
Figure 59:
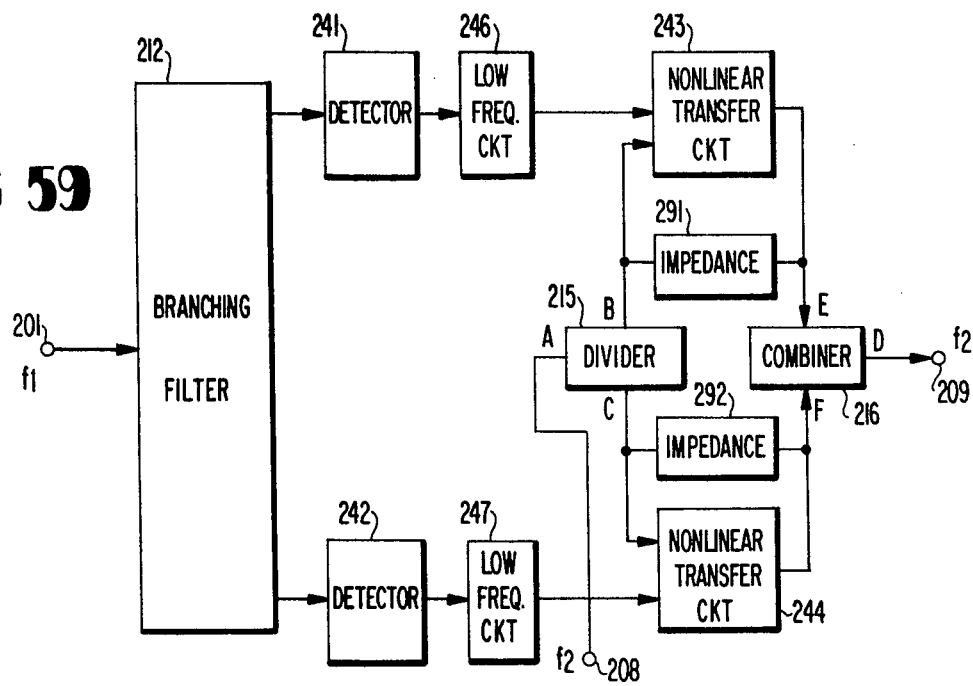
Figure 60:
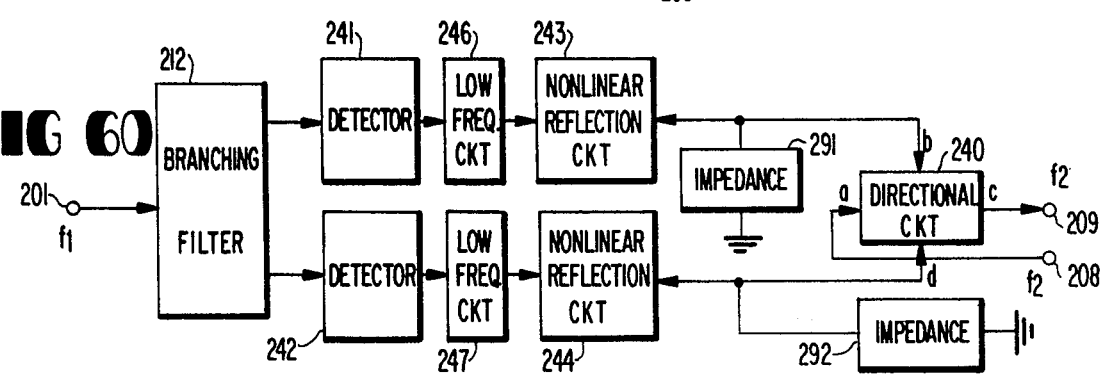
Figure 61:
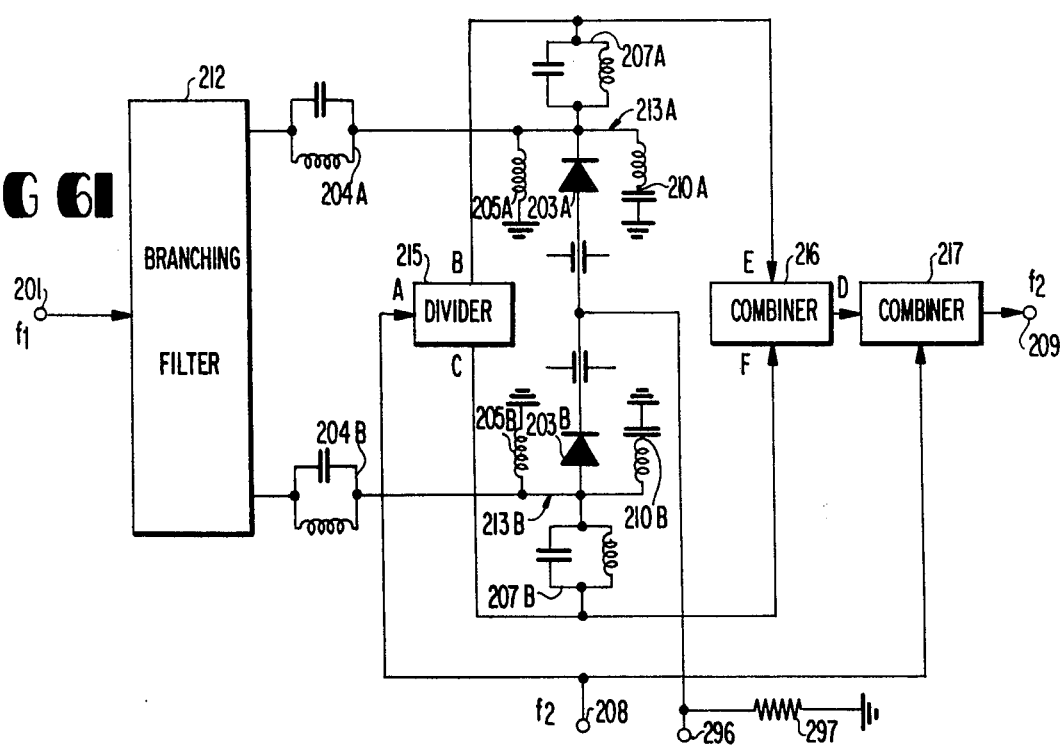
Figure 62:
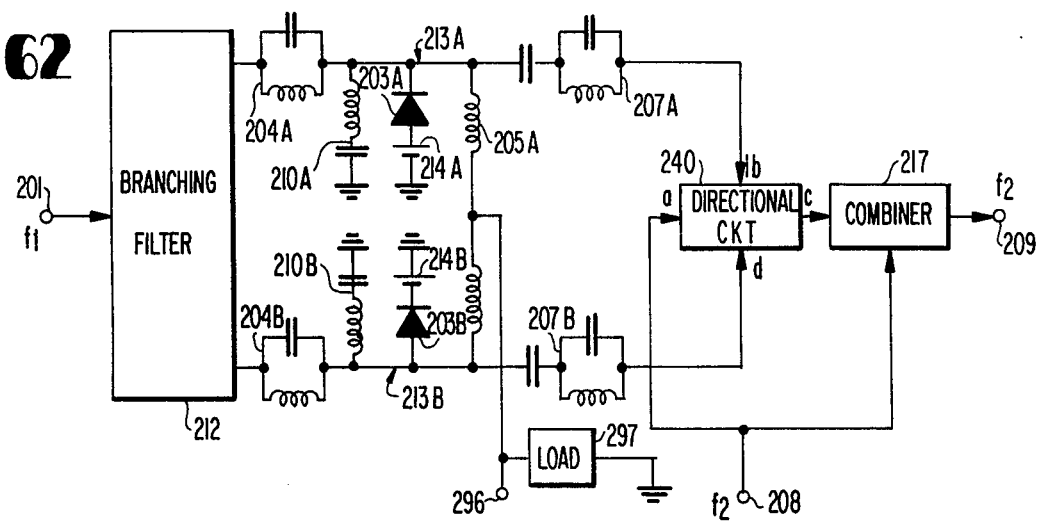
Figure 63:
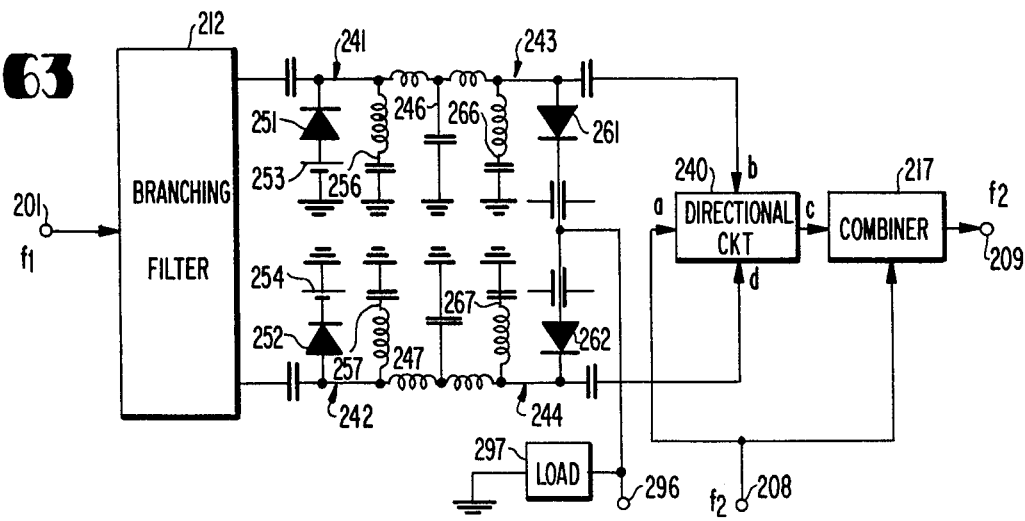
Figure 64:
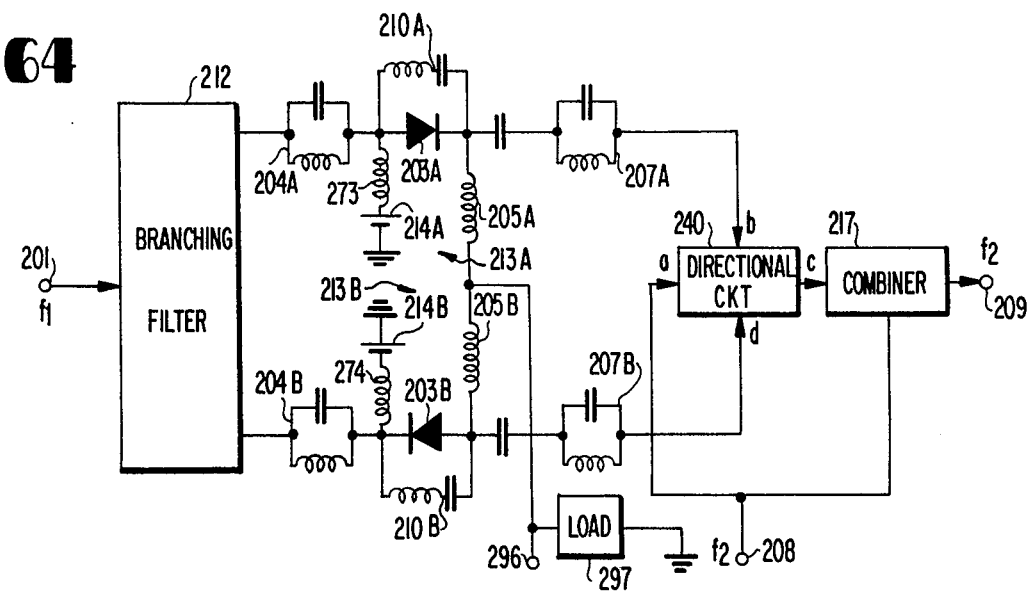
Figure 65:
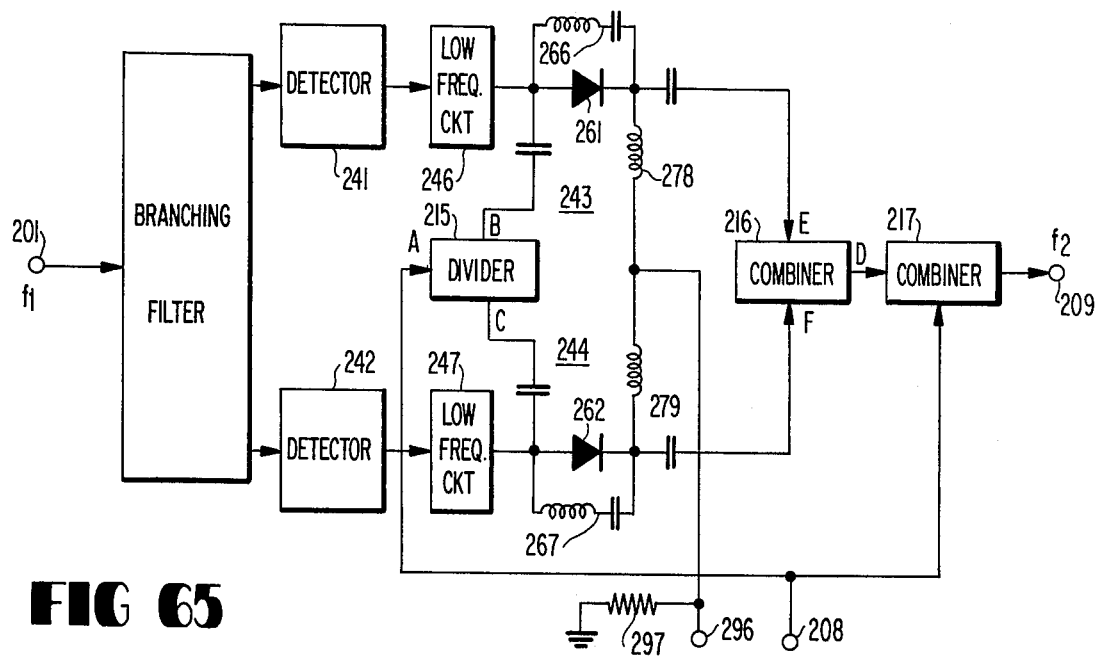

Referring to FIGS. 54 thru 56, FM-to-AM converters according to a tenth, an eleventh and a twelfth embodiment of this invention are similar to those according to the second through fourth embodiments, respectively. An attenuator 290, however, is substituted for the second combiner 217 as in an FM-to-AM converter according to the ninth embodiment.

Referring to FIGS. 57 thru 60, FM-to-AM converters according to a thirteenth, a fourteenth, a fifteenth and a sixteenth embodiment of this invention are again similar to those according to the first through fourth embodiments, respectively. A pair of impedance elements 291 and 292 of different impedances, however, are used instead of the second combiner 217 so as to render the small-signal impedances seen either from the divider 214 and the single combiner 216 or from the directional circuit 240 different from each other. The characteristics achieved are similar to those illustrated with reference to FIG. 53. Each of the impedance elements 291 and 292 may be a resistor, an inductor, a capacitor or any combination thereof. Instead of being connected in parallel as illustrated, the impedance elements 291 and 292 may be connected in series to the diode circuits 213A and 213B or 243 and 244.

Turning to FIGS. 61 thru 65, FM-to-AM converters according to a seventeenth, an eighteenth, a nineteenth, a twentieth and a twenty-first embodiment of this invention are similar to those according to the first, second, fourth, sixth and seventh embodiments, respectively. An additional terminal 296, nowever, is coupled as depicted to the low-frequency current path of the variable impedance circuits 213A and 213B or 243 and 244 and grounded through a load 297. That portion of the rectified current which is developed across the load 297 has an amplitude dependent on the FM signal frequency $f_1$ and thus has frequency discrimination characteristics. It will be seen that the bias sources may be omitted.

Figure 66:
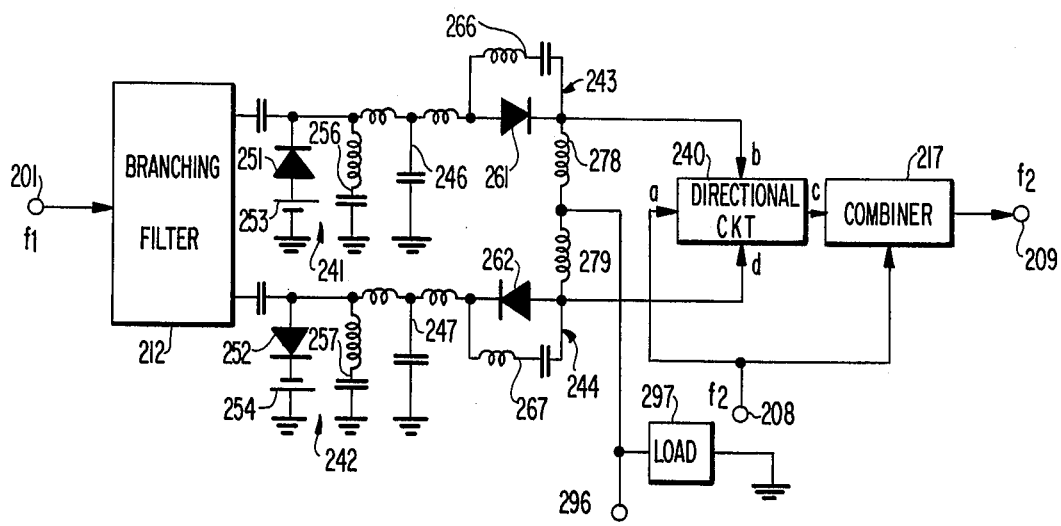

Referring to FIG. 66, an FM-to-AM converter according to a twenty-second embodiment of this invention is similar to those according to a combination of the third and eighth embodiments and to each of the seventeenth through twenty-first embodiments.

Figure 67:
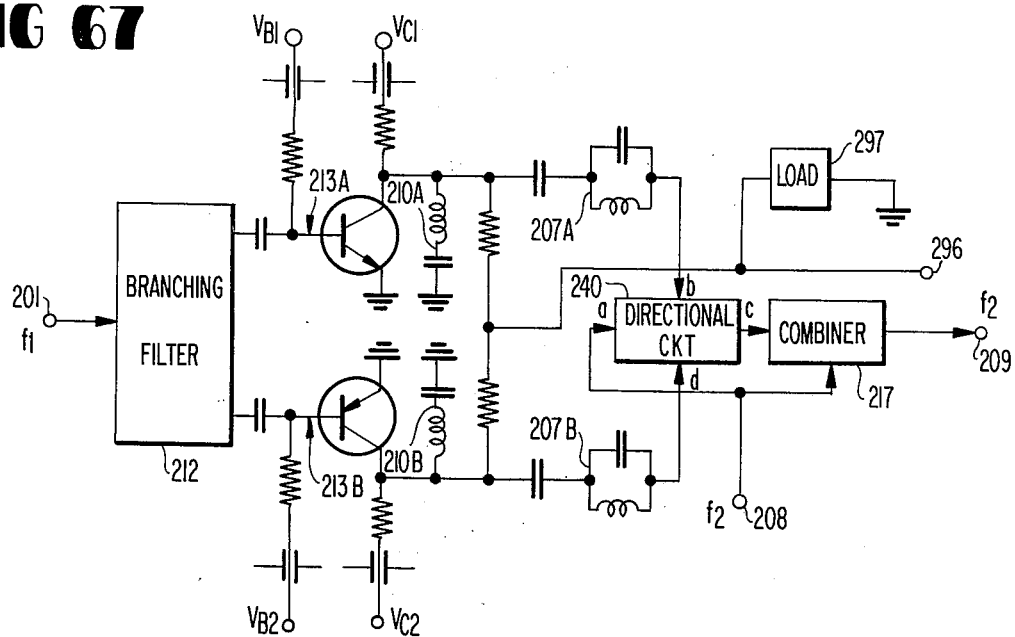
Figure 68:
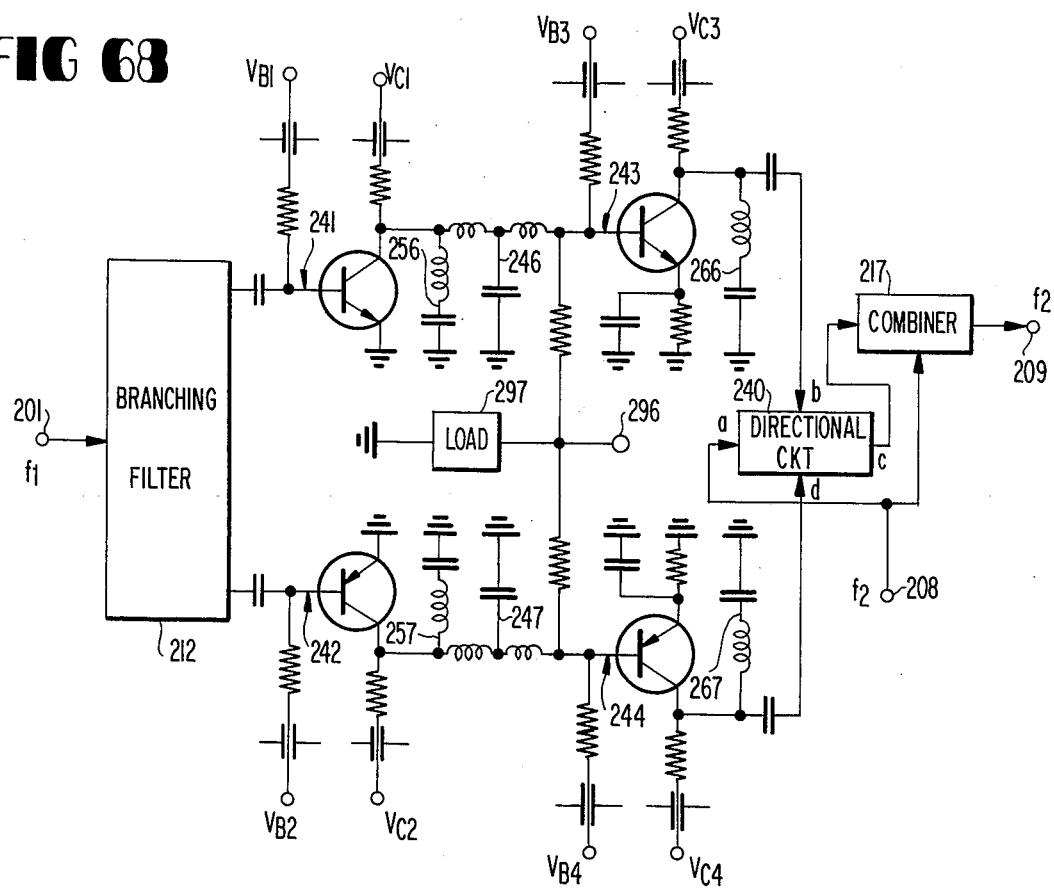

Referring to FIGS. 67 and 68, FM-to-AM converters according to a twenty-third and twenty-fourth embodiment of this invention are similar to those according to the eighteenth and nineteenth embodiments, respectively. In both of these embodiments, use is made of the circuit illustrated with reference to FIG. 44 as each of the diode circuits 213A, 213B, 241 and 242. In the converter according to the twenty-fourth embodiment, use is made, together with the filters 266 and 267 for shorting the high frequency signals, of the circuit illustrated with reference to FIG. 49 as each of the variable impedance circuits 243 and 244.

It is to be mentioned here that an FM-to-AM converter according to any one of the embodiments and modifications thereof may be provided with an additional terminal, such as 296.

Figure 69:
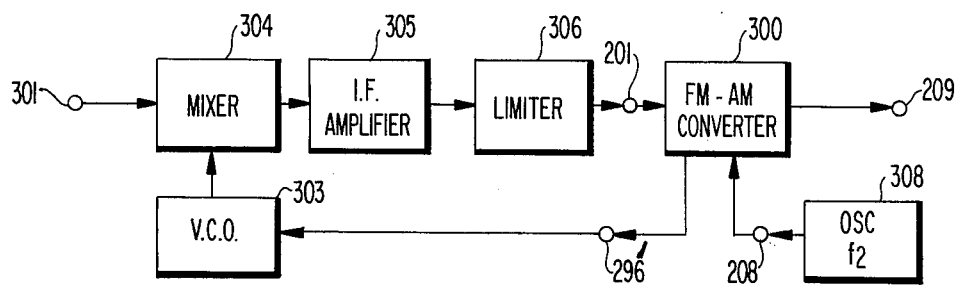

Turning to FIG. 69, an FM-to-AM converter according to a twenty-fifth embodiment of this invention comprises an FM-to-AM component converter 300 which may be any one of the first through twenty-fourth embodiments and modifications thereof and which has a component input terminal 201, an input port 208, and an output terminal 209 as well as an additional terminal 296 described hereinabove. The present converter comprises an input terminal 301 for the input FM signal, a voltage controlled oscillator 303 controlled by the d.c. current component derived from the additional terminal 296 for producing a first local oscillation, a mixer 304 connected to the input terminal 301 and voltage controlled oscillator 303 for producing an intermediate frequency signal, an intermediate frequency amplifier 305 for the intermediate frequency signal, and a limiter 306 connected between the intermediate frequency amplifier 305 and the component input terminal 201. The input port 208 is supplied with a second local oscillation of the carrier frequency $f_2$ from a local oscillator 308. It will readily be understood that this FM converter acts as a superheterodyne receiver and that the elements 303 through 306 connected between the terminals 201, 296 and 301 provide automatic frequency control to the FM signal supplied to the component input terminal 201 so that the center frequency $f_0$ may be kept invariable despite the possible fluctuation in the center frequency of the FM signal supplied to the input terminal 301.

Figure 70:
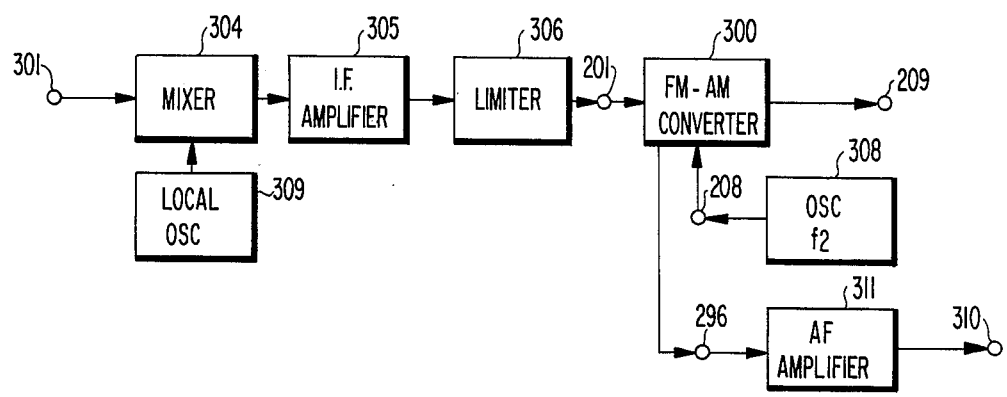

Referring to FIG. 70, an FM-to-AM converter according to a twenty-sixth embodiment of this invention is similar to that according to the twenty-fifth embodiment. Another local oscillator 309 is substituted for the voltage controlled oscillator 303 while the additional terminal 296 is connected to a low frequency output terminal 310 through a low frequency amplifier 311. It is possible with a converter according to this embodiment to monitor the input and output signals.

Figure 71:
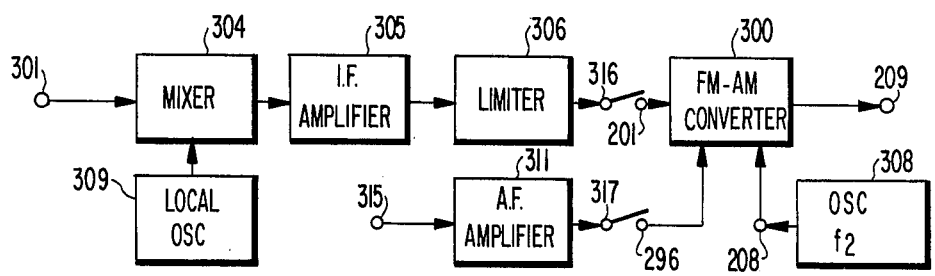
Figure 72:
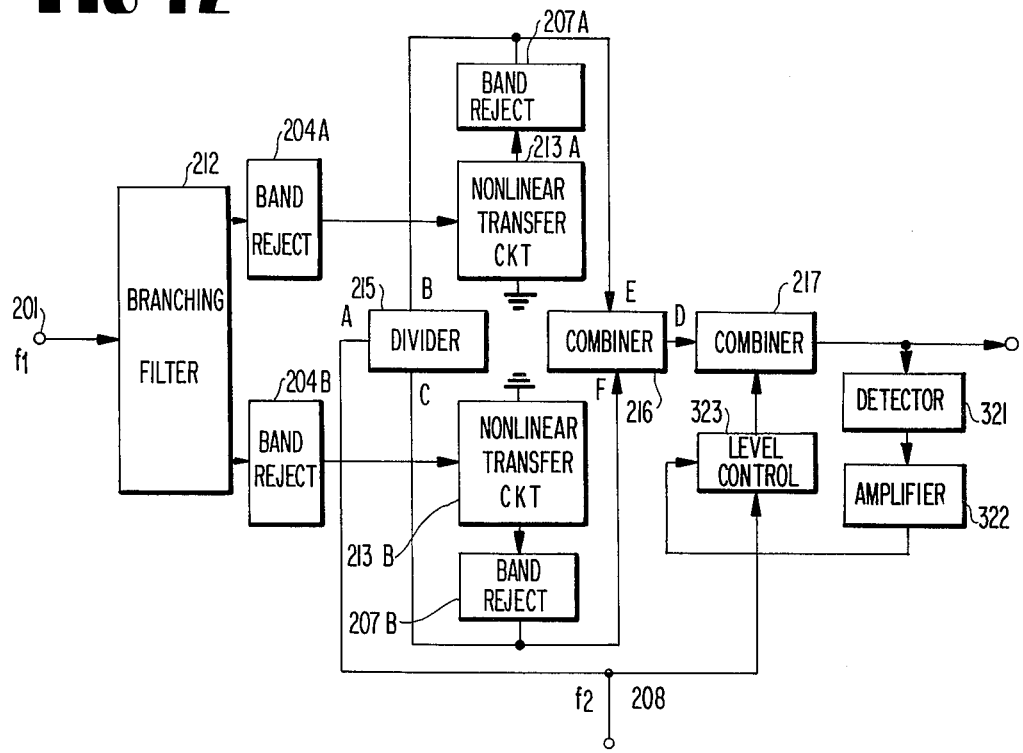
Figure 73:
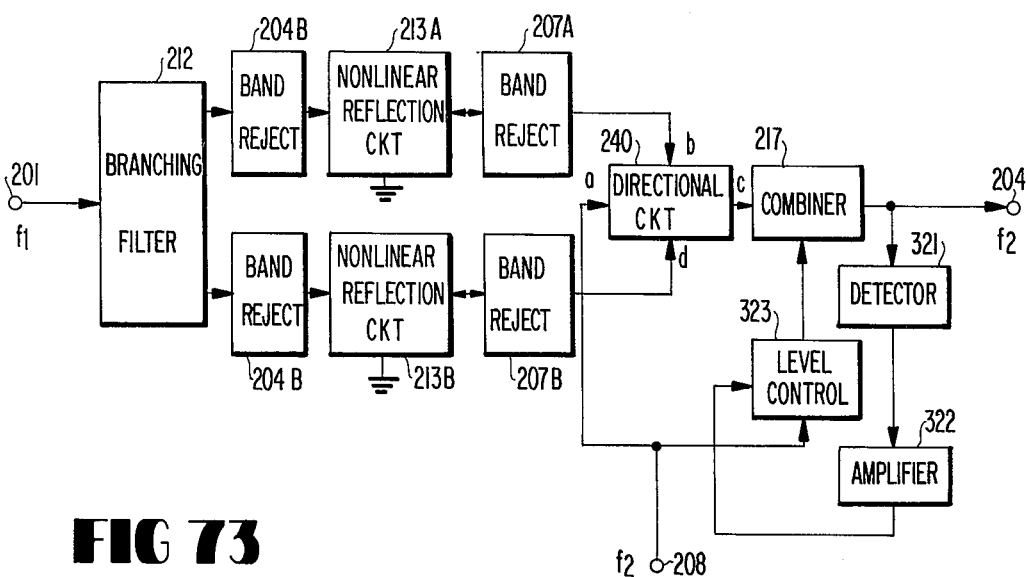
Figure 74:
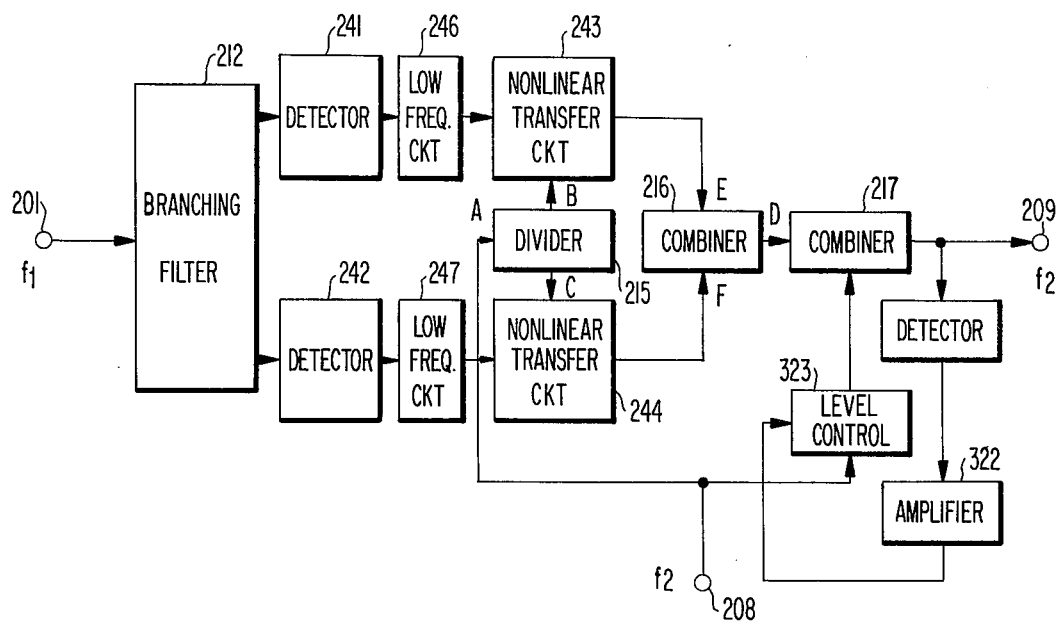
Figure 75:
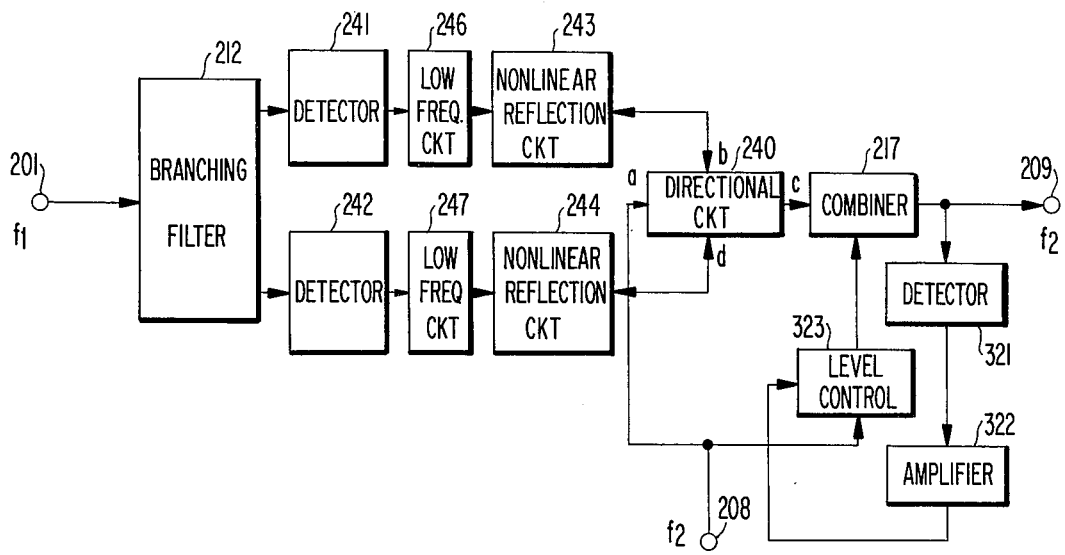
Figure 76:
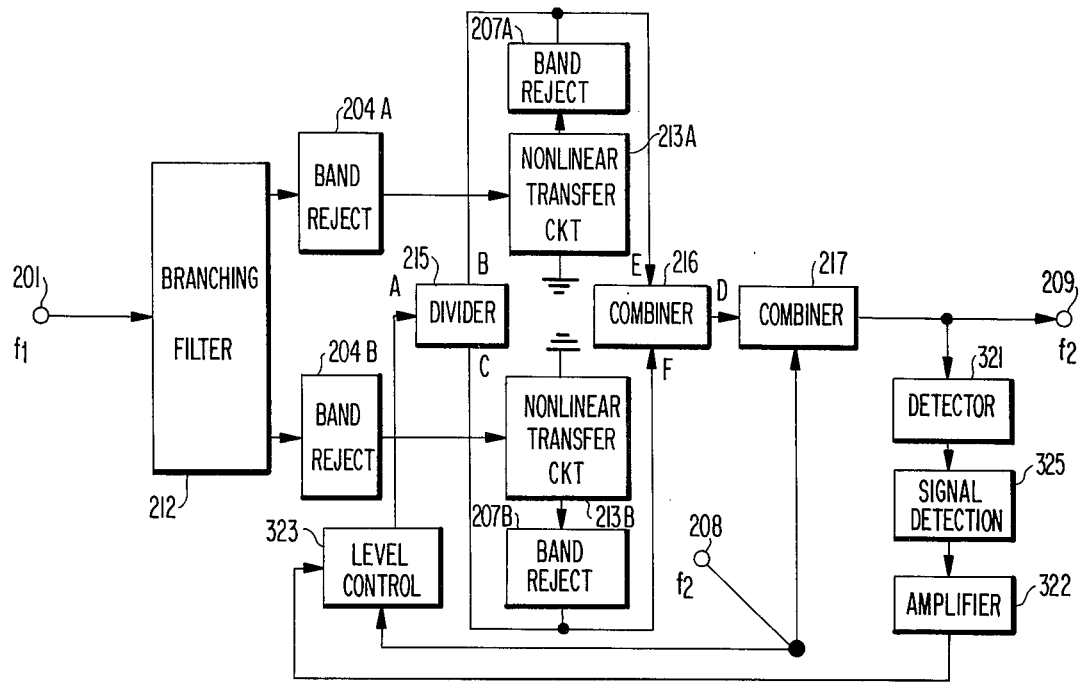
FIGS. 76 thru 79 are block diagrams of FM-to-AM converters according to thirty-second through thirty-fifth embodiments of this invention.
Figure 77:
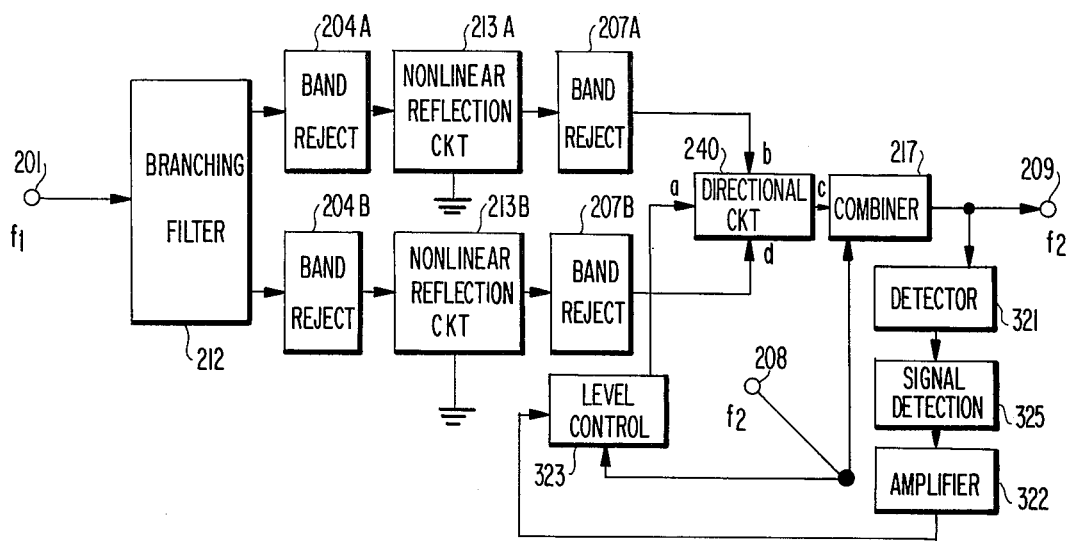
Figure 78:
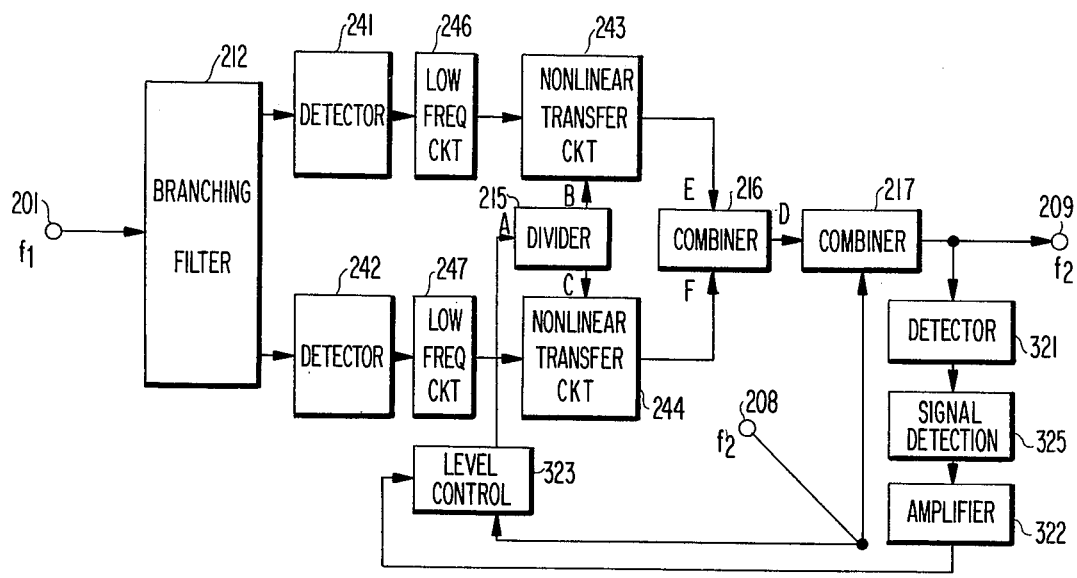
Figure 79:
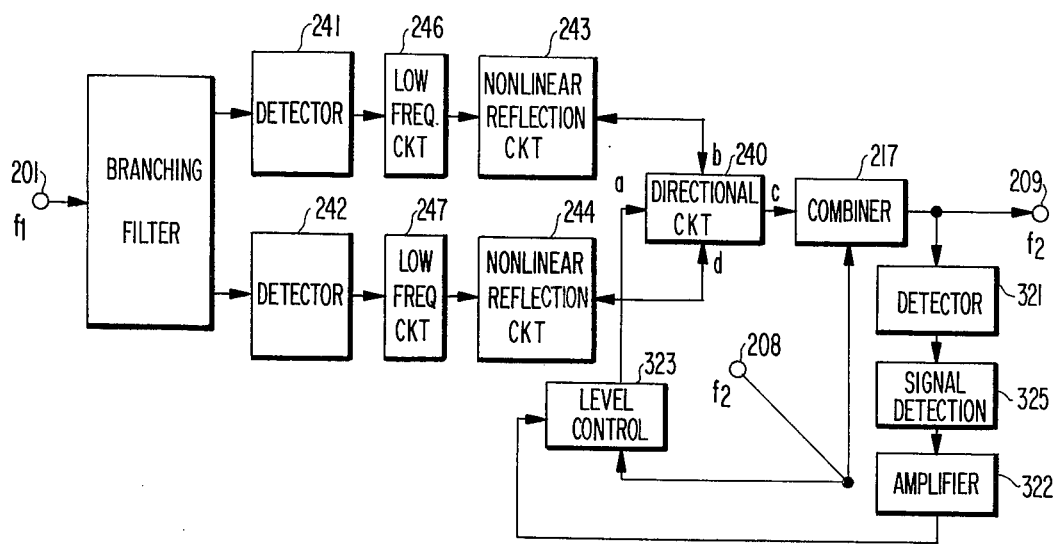

Referring to FIG. 71, an FM-to-AM converter according to a twenty-seventh embodiment of this invention is similar to that according to the twenty-sixth embodiment. Use is made of a low frequency input terminal 315 instead of the low frequency output terminal 310. First and second switches 316 and 317 are interposed between the component input terminal 201 and the limiter 306 and between the additional terminal 296 and the low frequency amplifier 311. With a converter according to this embodiment, either a low frequency signal may be substituted for or superposed on the FM signal to vary the small-signal impedance to amplitude modulate the carrier signal $f_2$ by the low frequency signal.

Turning to FIGS. 72 thru 75, FM-to-AM converters according to a twenty-eighth, a twenty-ninth, a thirtieth and a thirty-first embodiment of this invention are similar to those according to the first through fourth embodiments, respectively. A series connection of a detector 321, an amplifier 322, and a level control 323 is, however, connected between the output terminal 209 and a point between the input port 208 and the second combiner 217. It is possible with converters according to these embodiments to automatically control the amplitude $E_2$ of the output AM signal. Without the automatic amplitude control, the center amplitude of the output AM signal would dluctuate as is obvious from FIGS. 10 and 11 if the frequency $f_0$ of the input FM signal fluctuates for some reason or other. This is objectionable when the FM signal is modulated by a video signal because the peak amplitude of the synchronizing signals would accordingly fluctuate in the output AM signal. When use is made of a peak detector as the detector 321 and of a d.c. amplifier of a time constant shorter than the period of fluctuation of the FM signal center frequency $f_0$ as the amplifier 322, it is possible to keep the peak amplitude constant.

Figure 80:
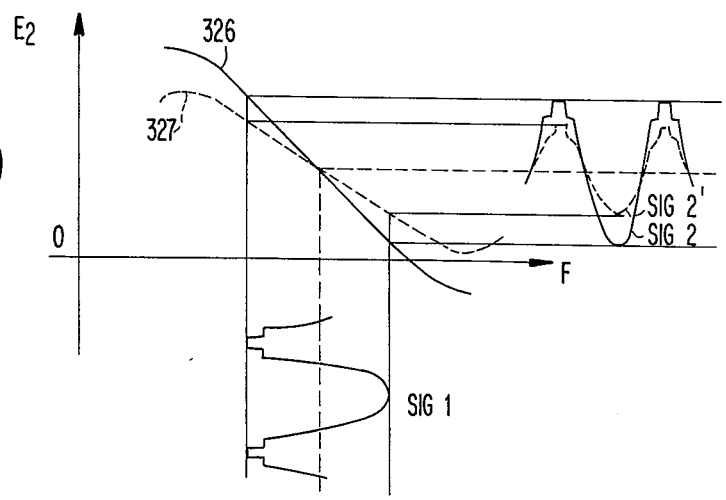
FIG. 80 shows signals for describing the operation of an FM-to-AM converter according to any one of the 32an through thirty-fifth embodiments.

Referring to FIGS. 76 thru 80, FM-to-AM converters according to a thirty-second, a thirty-third, a thirty-fourth and a thirty-fifth embodiment of this invention are similar to those according to the twenty-eighth through thirty-first embodiments except that the series connection of the detector 321, amplifier 322 and level control 232 is connected between the output terminal 209 and a point between the input port 208 and that port of either the divider 215 of the directional circuit 240 to which the carrier signal $f_2$ is otherwise directly supplied and that a signal detector 325 is interposed between the detector 321 and amplifier 322 for demodulating the output AM signal of a specific amplitude contained in the demodulated signal. This is to automatically control the output AM signal amplitude $E_2$ to a desired value. More particularly, let the input FM signal be modulated by a video signal to be indicated at SG1 (FIG. 80). Let the FM-to-AM conversion characteristics be represented by a curve 326. The output AM signal becomes as designated at SG2. Without the automatic amplitude control, the characteristics 326 may vary to be exaggeratedly represented by another curve 327 due to temperature variation or others. The output AM signal will then become as indicated at SG2'. With the automatic amplitude control, it is possible to automatically keep the characteristics unchanged so as to make it possible, in turn, to always detect the decrease in the amplitude of the synchronizing signals in the undesiredly varied AM signal SG2' and to accordingly increase the amplitude of the carrier signal $f_2$ supplied either to the divider 215 or the directional circuit 240 whereby it is rendered possible to automatically compensate for the undesired variation in the FM-to-AM conversion characteristics 326. Even when the input FM signal is modulated by multiplexed signals, the automatic amplitude control is possible by detecting that amplitude of the output AM signal which results from the modulation by one of the multiplexed signals.

Figure 81:
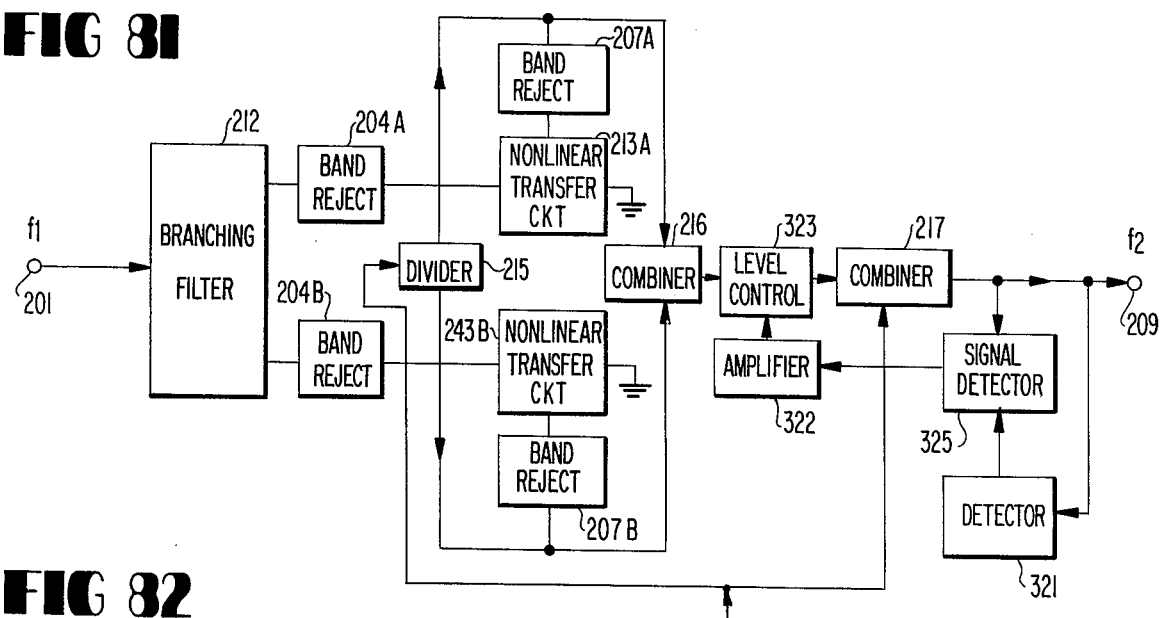
Figure 82:
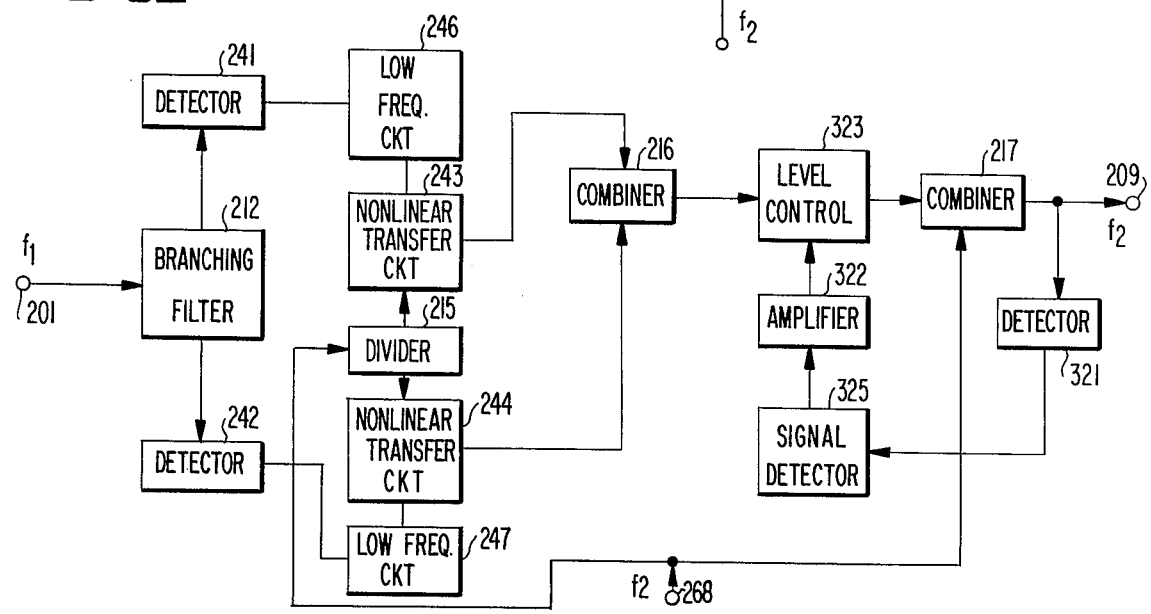
Figure 86:
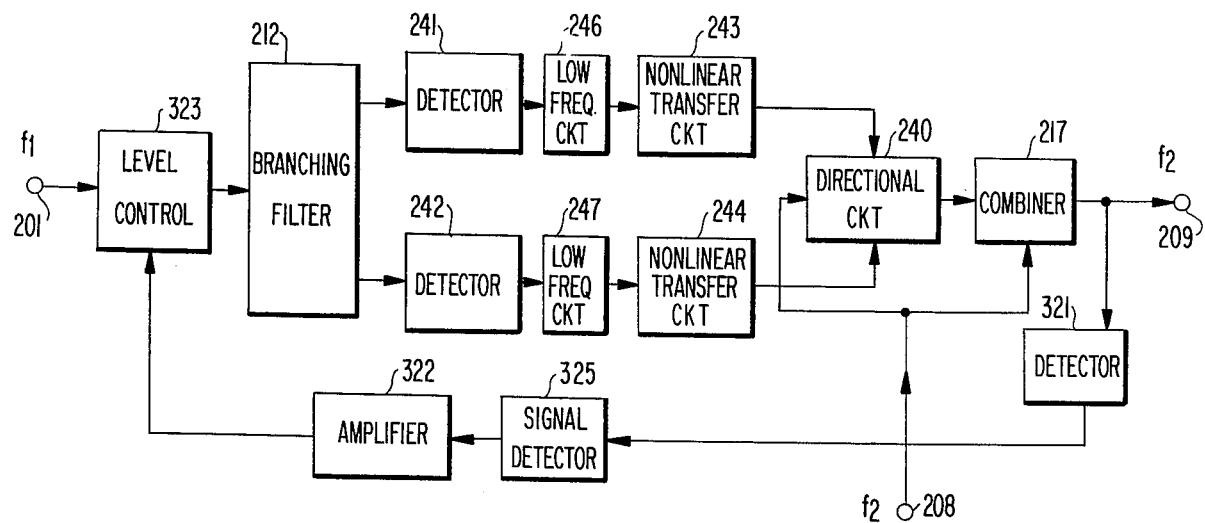
Figure 87:
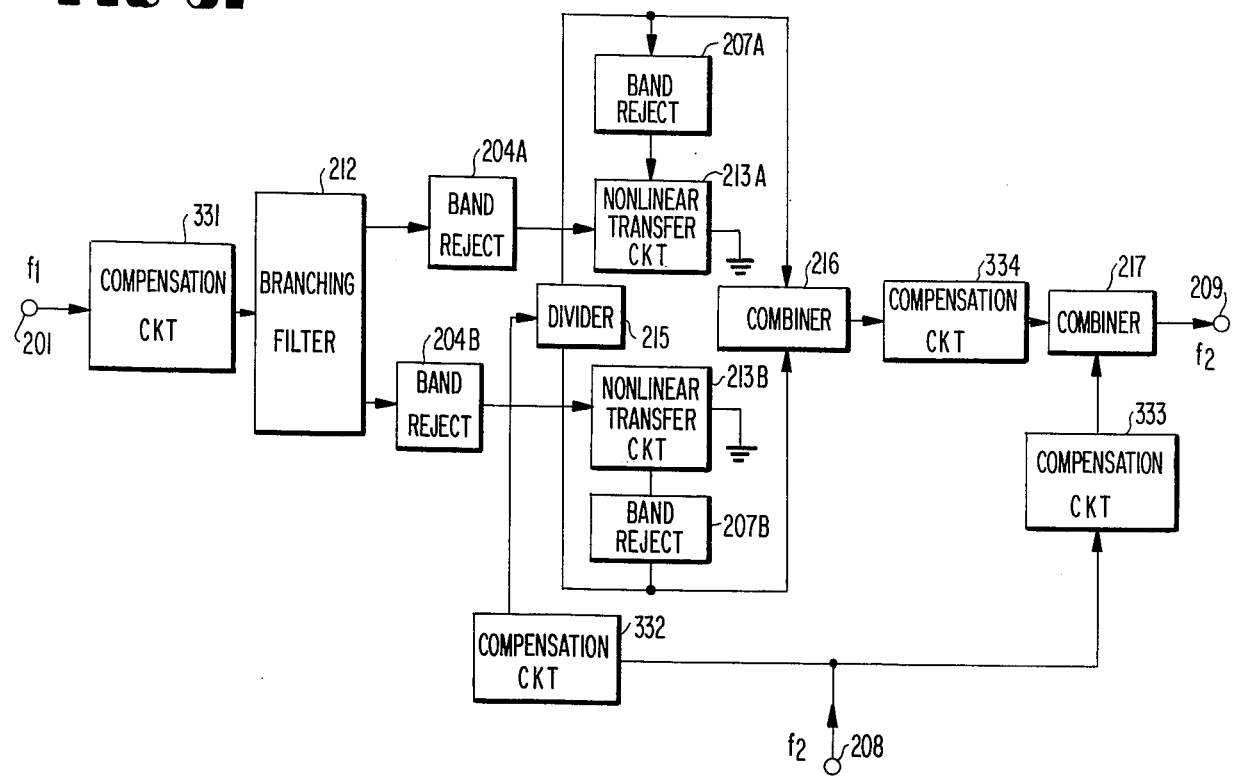
Figure 88:
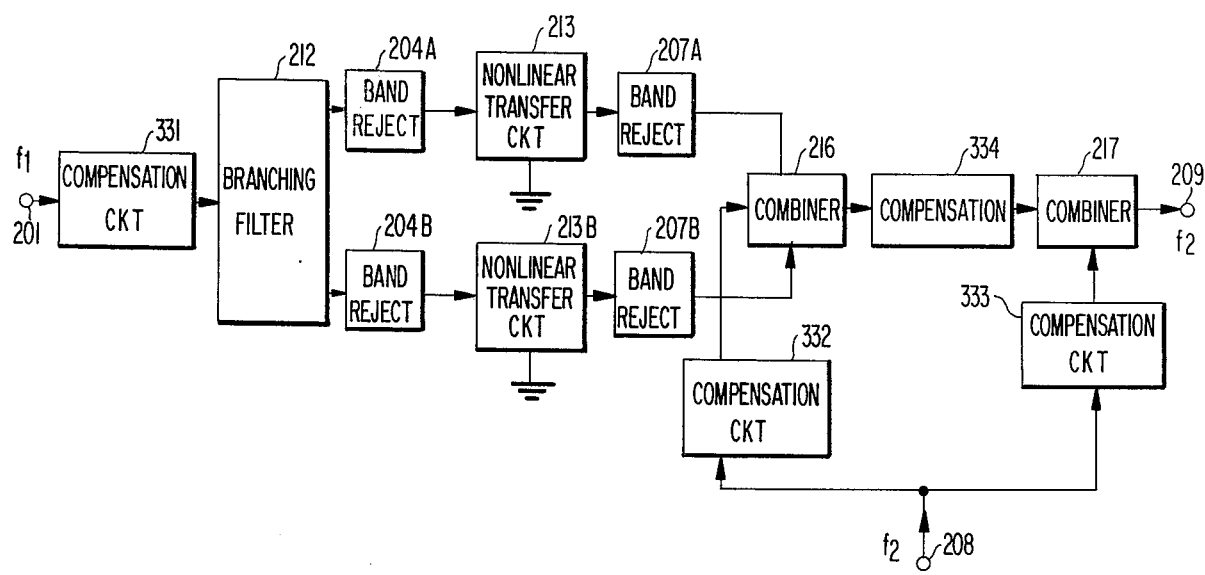
Figure 89:
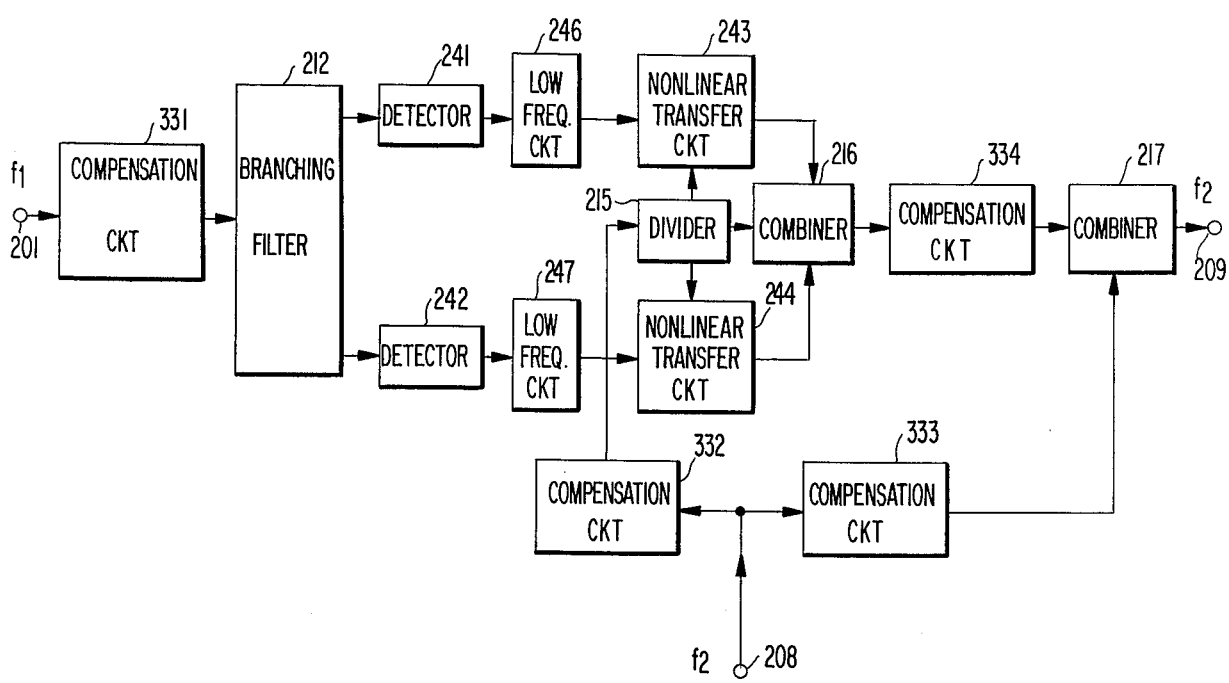
Figure 90:
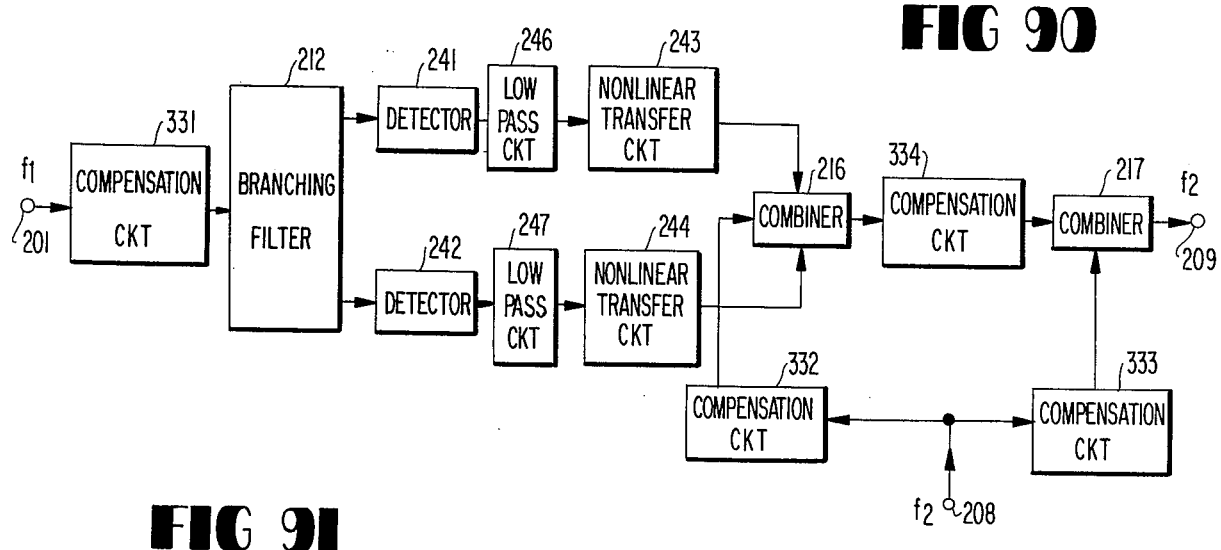

Referring to FIGS. 81 and 82, FM-to-AM converters according to a thirty-sixth and a thirty-seventh embodiment of this invention are similar to those according to the thirty-second and thirty-fourth embodiments except that the series connection of the detector 321, signal detector 325, amplifier 322 and level control 323 is connected between the output terminal 209 and a point between the first and second combiners 216 and 217. Converters according to these embodiments are provided with quite a similar feature as illustrated with reference to FIG. 80.

Referring to FIGS. 83 thru 86, FM-to-AM converters according to a thirty-eighth, a thirty-ninth, a fortieth and forty-first embodiment of this invention are similar to those according to the thirty-second through thirty-fifth embodiments except that the series connection of the detector 321, signal detector 325, amplifier 322 and level control 323 is connected between the output terminal 209 and input terminal 201. Converters according to these embodiments have quite a similar feature as is the case with the referenced embodiments.

Referring to FIGS. 87 thru 90, FM-to-AM converters according to a forty-second, a forty-third, a forthfourth and a forty-fifth embodiment of this invention are similar to those according to the first through fourth embodiments except that compensation circuits 331, 332, 333 and 334 are put prior to the branching filter 212, between the input port 208 and either the divider 215 and second combiner 217 or the directional circuit 240 and single combiner 217, and between either the first and second combiners 216 and 217 or the directional circuit 240 and single combiner 217. A converter of this type is preferred when the variation in the FM-to-AM converstion characteristics is previously known, like the variation resulting from the temperature change. Each of the compensation circuits 331 thru 334 may either be an amplifier or an attenuator for compensating the known variation, such as of an inverse temperature dependency.

It should be mentioned here that it is possible by the use of both the series connection illustrated with reference to FIGS. 72 thru 75 and the series connection described in conjunction with FIGS. 76 thru 79 and 81 thru 86 to automatically control both the peak value and the degree of modulation of the output AM signal. It should be understood that the compensation described in connection with the twenty-eighth through forty-fifth embodiments is applicable to any one of converters according to other embodiments.

Figure 91:
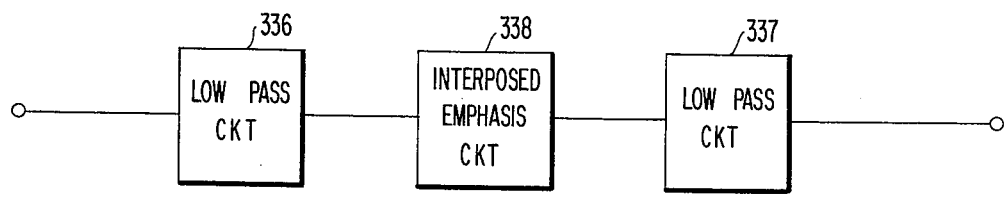
FIG. 91 is a block diagram of a low pass circuit for use in an FM-to-AM converter according to any one of the third, fourth, and seventh embodiments and of those similar embodiments and modifications thereof in each of which use is made of a pair of detectors, a pair of variable transfer or reflection circuits, and an interposed pair of low pass circuits.

Referring to FIG. 91, an FM-to-AM converter according to a modification of some of the above-described embodiments, such as that which comprises a low pass circuit 246 or 247 between the detector 241 and 242 and variable impedance circuit 243 or 244 as in the third, fourth and seventh embodiments, comprises first and second low pass circuits 336 and 337 and an interposed emphasis circuit 338 as the single low pass circuit 246 or 247. With this modification, it is possible to produce an output AM signal with frequency or emphasis characteristics.

Figure 92:
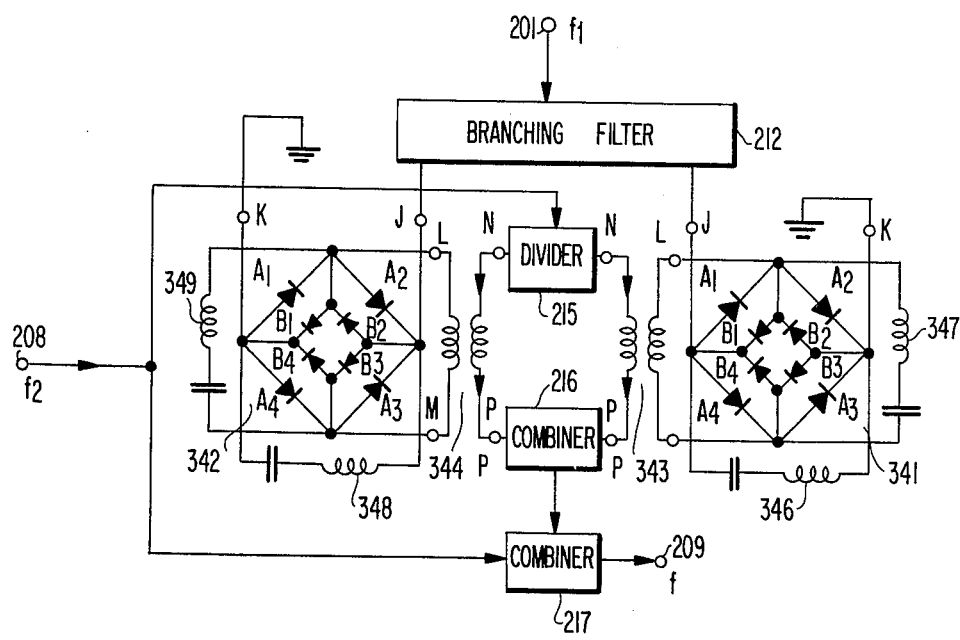
FIGS. 92 and 93 are block diagrams of FM-to-AM converters according to forty-sixth and forty-seventh embodiments of this invention.
Figure 93:
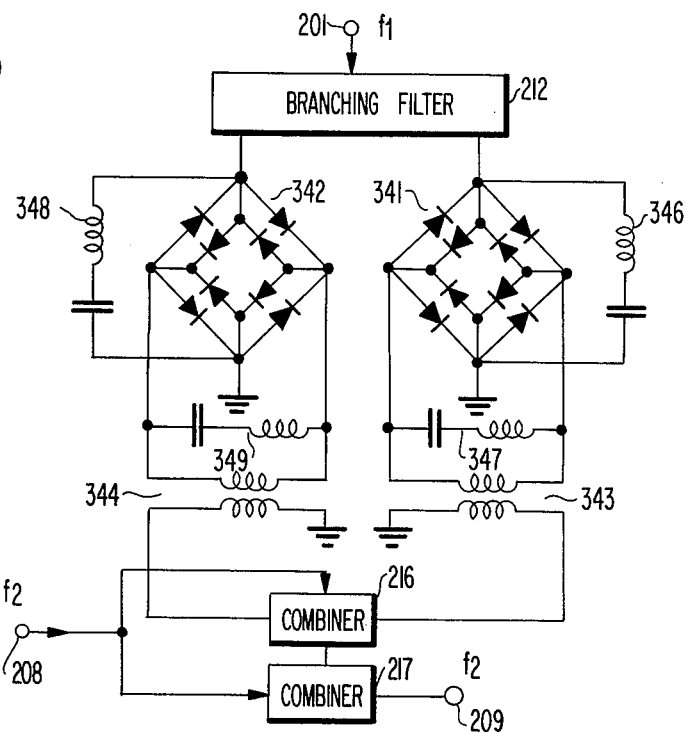

Turning now to FIGS. 92 and 93, each of FM-to-AM converters according to a forty-sixth and forty-seventh embodiment of this invention comprises an input terminal 201, an input port 208, an output terminal 209, a branching filter 212, and either a combination of a divider 215 and first and second combiners 216 and 217 or another combination of a directional circuit 240 and a single combiner 217 described hereinabove. Each of the converters further comprises first and second balanced diode bridge circuits 341 and 342 connected directly to the branching filter 212 and coupled either to the divider 215 and first combiner 216 or to the directional circuit 240 through first and second balanced-unbalanced converters 343 and 344. As will soon be described, it is possible by the use of the diode bridge circuits 341 and 342 to dispense with the first and second trap filters 204 and 207 or 204A, 204B, 207A and 207B used in the conventional converter and in the converters according to the above-described embodiments of this invention and modifications thereof. More particularly, the diode bridge circuits 341 and 342 comprise first terminals J connected to the branching filter 212, second terminals K grounded, and third and fourth terminals L and M connected to the balanced-unbalanced converters 343 and 344. A pair of the first and second bridge terminals J and K is isolated from another pair of the third and fourth terminals L and M. A diode bridge comprising diodes A1, A2, A3, A4, B1, B2, B3 and B4 is connected to the terminals J, K, L and M together with traps 346 or 347 and 348 or 349 for shorting some of the current components of the frequencies given by Formula (1). In a converter according to the forty-sixth embodiment, the FM component signal of the amplitude $E_{11}$ or $E_{12}$, supplied between the terminal pair J and K, produces rectified currents flowing through the diodes A1 through A4 and B1 through B4, which are dependent on the amplitude $E_{11}$ or $E_{12}$. As a result, the small-signal impedance $R_d$ of each diode varies in compliance with the amplitude $E_{11}$ or $E_{12}$ and hence with the input FM signal frequency $f_1$. When the diodes A1 through A4 and B1 through B4 have substantially the same characteristics, the bridge circuit 341 or 342 is balanced with respect to the FM component signals of the frequency $f_1$ os that a voltage of the frequency $f_1$ does not substantially appear between the terminal pair L and M. Inasmuch as the small-signal impedance $R_d$ of one of the diodes is now equal to that of another, the diode bridge circuit 341 or 342 is balanced with respect also to the carrier signal of the frequency $f_2$ when the carrier signal is of a sufficiently small amplitude. As a result, a signal of the frequency $f_2$ is not substantially developed between the terminal pair J and K. Furthermore, the small-signal impedance seen from the terminal pair L and M is given by:

$$R_d/2 \times 2 \times \tfrac{1}{2} = R_d/2,$$

so that the amplitude $E_2$ of the carrier signal $f_2$ varies at the output terminal 209 in compliance with that small-signal impedance $R_d/2$ which is seen from the terminal pair L and M. Although more diodes are necessary in a converter according to the forty-sixth or forth-seventh embodiment, this means that it is possible to increase the power of the output AM signal with an equal power supplied across each diode and that the output AM signal is less subject to the noise which may be superimposed on the AM signal in subsequent stages. In a converter according to the forty-seventh embodiment, the carrier signal $f_2$ is variably reflected by the diode bridge circuits 341 and 342.

Figure 94:
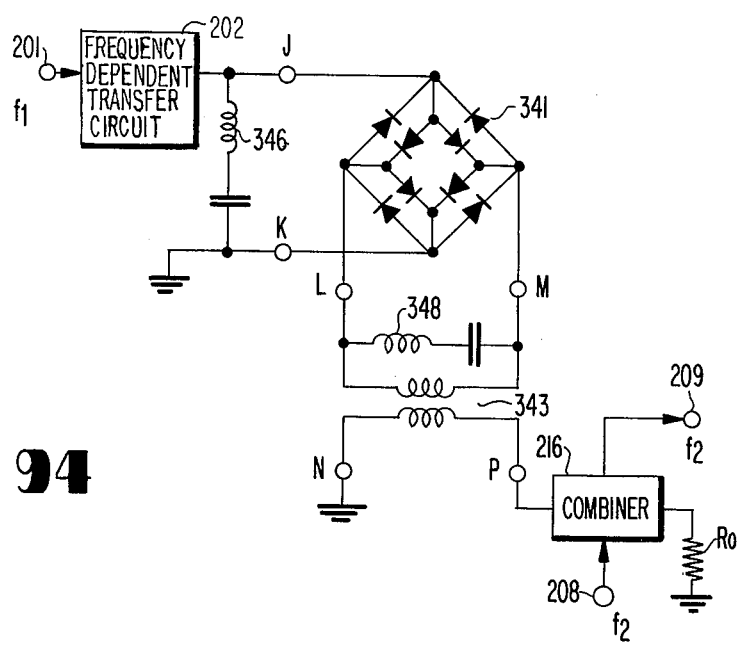
FIGS. 94 and 95 are block diagrams of those FM-to-AM converters according to forty-eight and forty-ninth embodiments of this invention which are capable of serving also as AM-to-AM converters.
Figure 95:
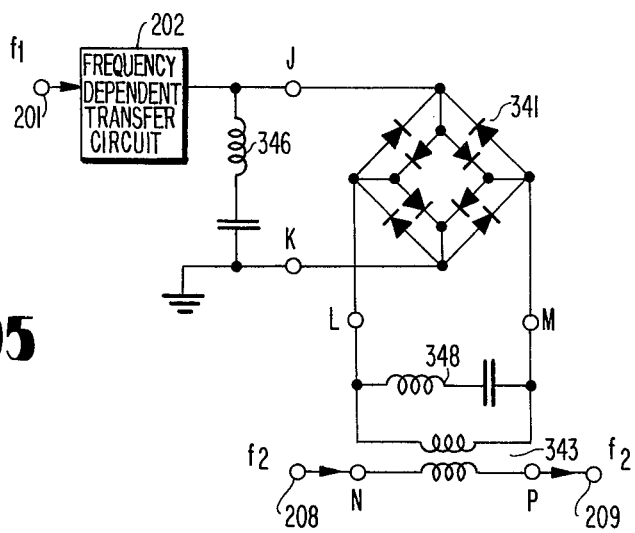

Referring to FIGS. 94 and 95, FM-to-AM converters according to a forty-eighth and forth-ninth embodiment of this invention are rather similar in outline to a conventional one illustrated with reference to FIG. 1. An FM-to-AM converter according to either of these embodiments, however, does not include the first and second trap filters 204 and 207 but comprises a balanced diode bridge circuit 341 and a balanced-unbalanced converter 343 instead of the single diode 203 and the associated elements 205 and 210. The balanced-unbalanced converter 343 has either one terminal N grounded and another terminal P connected to the directional circuit 206 or 240 or has a pair of terminals N and P used as the input "port" 208 and output terminal 209. Use is made of traps 346 and 348 for shorting current components of some of the frequencies given by Formula (1). It is possible to use a converter according to the forty-eighth or forty-ninth embodiment as an AM-to-AM converter for converting a first AM signal derived by modulating a carrier signal of a first frequency $f_1$ by a modulating signal to a second AM signal wherein a carrier signal of a second carrier frequency $f_2$ is modulated substantially by the modulating signal. In this event, the frequency dependent transfer circuit 202 is unnecessary.

Figure 96:
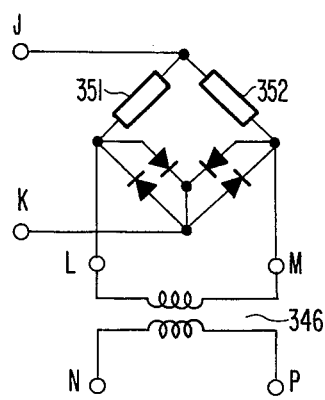
FIGS. 96 thru 100 show several examples of a balanced diode bridge, together with a balanced-unbalanced converter, for use in a carrier converter according to a modification of any one of the forty-sixth through forty-ninth embodiments.
Figure 97:
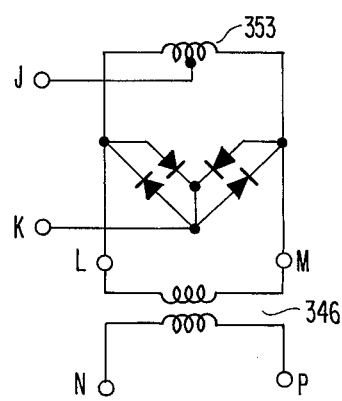
Figure 98:
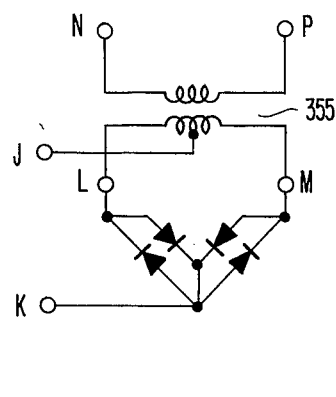

Turning to FIGS. 96 thru 98, a diode bridge may comprise a pair of impedance elements 351 and 352, a center tapped transformer 353, or a center tapped winding of a hybrid transformer 355 in two adjacent bridge branches. In the last event, the hybrid transformer 355 serves also as a balanced-unbalanced converter 346. The impedance element 351 or 352 may be a resistor, an inductor, a capacitor or any combination thereof.

Figure 99:
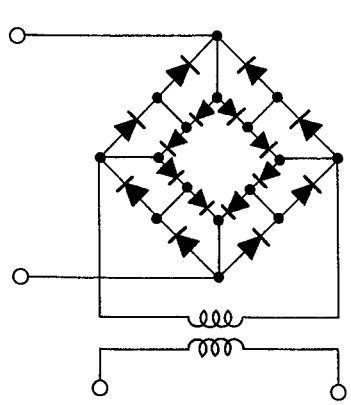
Figure 100:
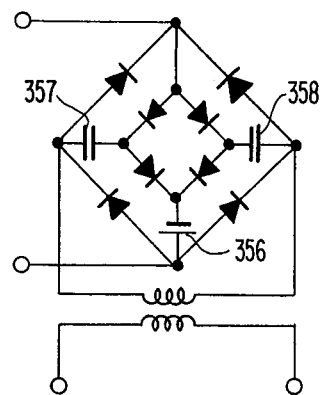
Figure 101:
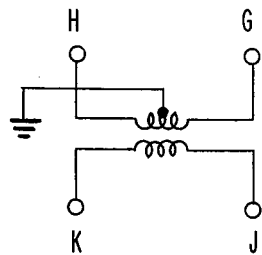
FIGS. 101 thru 105 show examples of a balanced-unbalanced converter for use in a carrier converter according to a modification of any one of the forty-sixth through forty-ninth embodiments of this invention.
Figure 102:
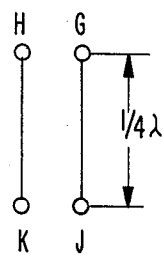
Figure 103:
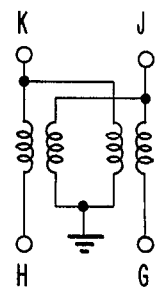
Figure 104:
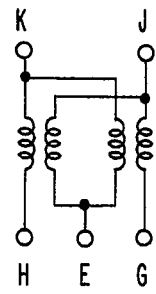
Figure 105:
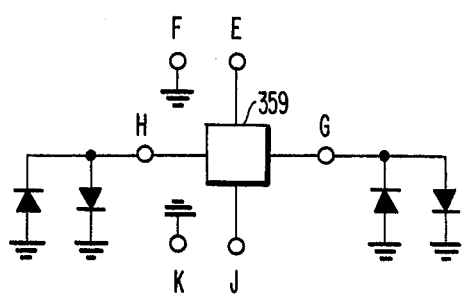

Referring to FIGS. 99 and 100, a diode bridge may comprise a series, a parallel, or a series and parallel connection of diodes instead of a single diode A1, A2 or the like as exemplified in FIG. 99. Alternatively, a diode bridge may comprise a bias source 356 and capacitor 357 and 358 for biassing the diodes in various manner.

Referring to FIGS. 101 thru 105, a balanced-unbalanced converter 346, 347, 348 or 349 may be a center tapped transformer, a pair of quarter wave length lines, a balun transformer (FIGS. 103 and 104), or a combination of a directional or a hybrid coupler or magic tee 359 and several diodes.

It is to be mentioned here in connection with carrier converters according to the forty-sixth through forty-ninth embodiments that the balanced-unbalanced converter 343 and/or the like may be connected between the other bridge terminal pair J and K instead of the illustrated terminal pair L and M or between both bridge terminal pairs. When use is made of the diode bridge shown in FIGS. 96 thru 95, the bridge terminal pairs may be interchanged. In the bridge circuit illustrated with reference to FIG. 92, the diodes may be only those labelled A1 through A4, B1 through B4, A1, A2, B3 and B4, or A3, A4, B1 and B2. This applied likewise to the diode bridge depicted in FIGS. 96 thru 98. The diodes may separately be biassed. Each of the diodes may be a PN junction diode, a Schottky barrier diode, a tunnel diode, a varactor diode, an IMPATT diode, a Gunn diode, or any other non-linear active circuit element. Furthermore, diode characteristics of a multi-electrode active circuit element may be substituted for each diode.

While this invention has thus far been described in conjunction with a plurality of embodiments thereof and various modifications, it will now be readily possible by those skilled in the art to put this invention into effect in various other ways. It will also be understood that the different frequency ranges mentioned in the preamble of the instant specification may have an overlapping frequency range and that the fourth and fifth means set forth also in the preamble correspond to the connection between the input terminal 201 or 301 and the branching filter 212 and to those of the connections between the branching filter 212 and the variable impedance circuits 213A and 213B or 241, 242, 243 and 244 and of the connections between the input port 208 and the variable impedance circuits 213A and 213B or 241, 242, 243 and 244 which do not correspond to the second means.

What is claimed is:

1. A carrier converter for converting a frequency modulated signal derived by modulating a first carrier signal by a modulating signal to an amplitude modulated signal derived by modulating a second carrier signal substantially by said modulating signal, including a first variable impedance circuit having a first impedance dependent on the amplitude of a first input signal, first means responsive to said frequency modulated signal for producing an output signal of an amplitude varying in relation to the frequency of said frequency modulated signal, second means responsive to said output and second carrier signals for supplying said output signal as said input signal and said second carrier signal to said variable impedance circuit, and third means operatively coupled to said variable impedance circuit for deriving said amplitude modulated signal, wherein the improvement comprises:

a second variable impedance circuit having a second impedance dependent on the amplitude of a second input signal;

said first means comprising:

a branching filter responsive to a single input signal of a varying frequency for producing a first and a second component signal as said output signal, said first and second component signals having a first and a second amplitude varying in relation to said varying frequency in different frequency ranges; and fourth means responsive to said frequency modulated signal for supplying said single input signal to said branching filter;

said first component signal serving as the output signal supplied by said second means to said first variable impedance circuit and the improvement further comprises:

fifth means responsive to said second component and second carrier signals for supplying said second component signal as said second input signal and said second carrier signal to said second variable impedance circuit;

said third means being operatively coupled further to said second variable impedance circuit.

2. A carrier converter as claimed in claim 1, wherein:

said third means comprises a combiner having a first and a second input port and an output port and being responsive to a first and a second port input signal supplied to said first and second input ports for producing a port output signal having a first and a second predetermined phase angle with said first and second port input signals;

said converter further comprising a divider having a single input port and a first and a second output port and being responsive to said second carrier signal supplied to said single input port for producing output carrier signals from said first and second ports with a third and a fourth predetermined phase angle with the second carrier signal supplied to said signle input port;

each of said second and fifth means comprising sixth means for supplying the component signal to the variable impedance circuit and seventh means for supplying the output carrier signal to the variable impedance circuit;

said variable impedance circuits thereby transferring said output carrier signals supplied thereto from said seventh means to said first and second input ports as said port input signals with the amplitudes modulated in compliance with the impedances varied by the component signals supplied thereto from said sixth means;

said combiner thereby producing said port output signal as said amplitude modulated signal.

3. A carrier converter as claimed in claim 2, wherein each of said variable impedance circuit comprises:

a detector responsive to the component signal supplied thereto from said sixth means for producing a detection signal varying with the amplitude of the supplied component signal;

a transfer circuit having variable transfer characteristics dependent on a supplied varying signal for varying the amplitude of the output carrier signal supplied thereto from said seventh means to produce the port input signal; and a low pass circuit for supplying the detection signal to said transfer circuit as said supplied varying signal while shorting the low pass circuit comprised by one of said variable impedance circuits and the low pass circuit comprised by the other variable impedance circuit as regards said component and output carrier signals.

4. A carrier converter as claimed in claim 1, further comprising a directional circuit having a first, a second, a third and a fourth port and responsive to said second carrier signal supplied to said first port for producing output carrier signals from said second and fourth ports with a first and a second predetermined phase angle with the second carrier signal supplied to said first port, respectively, and responsive to port input signals supplied to said second and fourth ports for producing a port signal from said third port with a third and a fourth predetermined phase angle with said port input signals, respectively;

said third means coupling said variable impedance circuits to said second and fourth ports;

each of said second and fifth means comprising sixth means for supplying the component signal to the variable impedance circuit and seventh means for supplying the output carrier signal to the variable impedance circuit;

said variable impedance circuits thereby reflecting said output carrier signals supplied thereto from said seventh means to said second and fourth ports through said third means as said port input signals with the amplitude modulated in compliance with the impedances varied by the component signals supplied thereto from said sixth means;

said directional coupler thereby producing said port output signal as said amplitude modulated signal.

5. A carrier converter as claimed in claim 4, wherein each of said variable impedance circuits comprises:

a detector responsive to the component signal supplied thereto from said sixth means for producing a detection signal varying with the amplitude of the supplied component signal;

a reflection circuit having variable reflection characteristics dependent on a supplied varying signal for varying the amplitude of the output carrier signal supplied thereto from said seventh means to produce the port input signal; and a low pass circuit for supplying the detection signal to said reflection circuit as said supplied varying signal while shorting the low pass circuit comprised by one of said variable impedance circuits and the low pass circuit comprised by the other variable impedance circuit as regards said component and output carrier signals.

6. A carrier converter as claimed in claim 1, wherein each of said variable impedance circuits comprises:

a diode bridge circuit having a first and a second pair of bridge terminals being balanced with respect to a first bridge signal supplied to the first pair of bridge terminals and to a second bridge signal supplied to the second pair of bridge terminals, said first pair of bridge terminals being isolated from said second pair of bridge terminals;

each of said second and fifth means supplying the component and said second carrier signal to said first pair of and second pair of bridge terminals as said first and second bridge signals, respectively;

said third means being coupled to said second pair of bridge terminals of each diode bridge circuit.

7. A carrier converter as claimed in claim 1, wherein: said first variable impedance circuit comprises a first low frequency circuit having a pair of ends and said first variable impedance, means responsive to said first component signal supplied thereto from said second means for varying said first variable impedance in compliance with the amplitude of said first component signal, and means for supplying said second carrier signal to one of said low frequency circuit ends, said low frequency circuit thereby causing a first low frequency signal varying with the variation of said first impedance to pass therethrough, said low frequency circuit being incapable of causing that first high frequency signal to pass therethrough which has frequencies substantially equal to the frequencies of said first component and said second carrier signals; and said second variable impedance circuit comprises a second low frequency circuit having a pair of ends and said second variable impedance, means responsive to said second component signal supplied thereto from said fifth means for varying said second variable impedance in compliance with the amplitude of said second component signal, and means for supplying said second carrier signal to one of said second low frequency circuit ends, said second low frequency circuit thereby causing a second low frequency signal varying with the variation of said second impedance to pass therethrough, said second low frequency circuit being incapable of causing that second high frequency signal to pass therethrough which has frequencies substantially equal to the frequencies of said second component and said second carrier signals;

said converter further comprising an additional terminal coupled to the other ends of said first and second low frequency circuits.

8. A carrier converter as claimed in claim 1, further comprising:

an input terminal for said second carrier signal;

a combiner;

an output terminal connected to said combiner;

sixth means for supplying said second carrier signal from said input terminal to said combiner; and seventh means for supplying said amplitude modulated signal from said third means to said combiner said combiner thereby shifting an amplitude of said amplitude modulated signal by an amplitude of said second carrier signal to supply an amplitude modulated and shifted signal to said output terminal.

9. A carrier converter as claimed in claim 8, further comprising means connected between said output terminal and said sixth means for controlling the amplitude of the second carrier signal supplied to said combiner in response to said amplitude modulated and shifted signal.

10. A carrier converter as claimed in claim 8, further comprising:

eighth means for supplying said second carrier signal from said input terminal to said second and fifth means; and means connected between said output terminal and said eighth means for controlling the amplitude of the second carrier signal supplied from said input terminal to said second and fifth means in response to said amplitude modulated and shifted signal.

11. A carrier converter as claimed in claim 8, further comprising means connected between said output terminal and said seventh means for controlling the amplitude of the amplitude modulated signal supplied from said third means to said combiner in response to said amplitude modulated and shifted signal.

12. A carrier converter as claimed in claim 8, further comprising means connected between said output terminal and said fourth means for controlling the amplitude of the frequency modulated signal supplied to said branching filter as siad single input signal in response to said amplitude modulated and shifted signal.

13. In a carrier converter for converting a frequency modulated signal derived by modulating a first carrier signal by a modulating signal to an amplitude modulated signal derived by modulating a second carrier signal substantially by said modulating signal, comprising a variable impedance circuit having a variable impedance dependent on the amplitude of an input signal, first means responsive to said frequency modulated signal for producing an output signal of an amplitude varying in relation to the frequency of said frequency modulated signal, second means for supplying said output signal as said input signal to said variable impedance circuit, and third means for supplying said second carrier signal to said variable impedance circuit, and fourth means operatively coupled to said variable impedance circuit for deriving said amplitude modulated signal, the improvement wherein:

said variable impedance circuit comprises a diode bridge circuit having a first and a second pair of bridge terminals and being balanced with respect to a first bridge signal supplied to the first pair of bridge terminals and to a second bridge signal supplied to the second pair of bridge terminals, said first pair of bridge terminals being isolated from said second pair of bridge terminals;

said second means supplying said output signal to said first pair of bridge terminals as said first bridge signal and said third means supplying said second carrier signal to said second pair of bridge terminals as said second bridge signal;

said fourth means being coupled to said second pair of bridge terminals via said third means, said second carrier being applied to said fourth means.

14. In a carrier converter for converting a first amplitude modulated signal derived by modulating a first carrier signal by a modulating signal to a second amplitude modulated signal derived by modulating a second carrier signal substantially by said modulating signal, comprising a variable impedance circuit having a variable impedance dependent on the amplitude of an input signal, first means for supplying said first amplitude modulated signal as said input signal to said variable impedance circuit, and second means for supplying said second carrier signal to said variable impedance circuit, and a third means operatively coupled to said variable impedance circuit for deriving said second amplitude modulated signal, the improvement wherein:

said variable impedance circuit comprises a diode bridge circuit having a first and a second pair of bridge terminals and being balanced with respect to a first bridge signal supplied to the first pair of bridge terminals and to a second bridge signal supplied to the second pair of bridge terminals, said first pair of bridge terminals being isolated from said second pair of bridge terminals;

said first meamns supplying said first amplitude modulated signal to said first pair of bridge terminals as said first bridge signal and said second means supplying said second carrier signal to said second pair of bridge terminals as said second bridge signal;

said third means being coupled to said second pair of bridge terminals via said second means, said second carrier signal being applied to said third means.

* * * * *

UNITED STATES PATENT AND TRADEMARK OFFICE
CERTIFICATE OF CORRECTION

PATENT NO. : 4,093,919
DATED : June 6, 1978
INVENTOR(S) : Hiroshi WATANABE

It is certified that error appears in the above-identified patent and that said Letters Patent are hereby corrected as shown below:

Column 1, line 23 - delete "AM-FM" insert -- FM-to-AM --

Column 2, line 58 - delete "32an" insert -- thirty-second -- line 59 - delete "diagram" insert -- diagrams --

Column 3, line 59 - after "circuit" delete "so"

Column 4, line 3 - after "circuit" insert -- and -- line 9 - delete "parastic" insert -- parasitic -- line 36 - delete "Inasmush" insert -- Inasmuch -- line 60 - after "carrier" insert -- frequency -- line 68 - delete "base" insert -- bias --

Column 5, lines
         5 and 6 - delete "to another" (second occurrence)

UNITED STATES PATENT AND TRADEMARK OFFICE
CERTIFICATE OF CORRECTION

PATENT NO. : 4,093,919
DATED : June 6, 1978
INVENTOR(S) : Hiroshi WATANABE

It is certified that error appears in the above-identified patent and that said Letters Patent are hereby corrected as shown below:

Column 5, line 58 - after "have" insert -- opposite --

Column 7, line 20 - after "signal" insert -- directional -- line 37 - after "<da)" insert -- | -- line 45 - after "as a" delete "signal" insert -- single --.

line 46 - after "amplitude" insert -- $E_{23}$ -- line 48 - delete "conventer" insert -- converter -- line 51 - delete "FIGS." insert -- FIG. --

Column 8, line 2 - delete "pias" insert -- bias -- line 29 - after "input" insert -- FM -- line 35 - after "because no" insert -- current --

UNITED STATES PATENT AND TRADEMARK OFFICE
CERTIFICATE OF CORRECTION

PATENT NO. : 4,093,919
DATED : June 6, 1978
INVENTOR(S) : Hiroshi WATANABE

It is certified that error appears in the above-identified patent and that said Letters Patent are hereby corrected as shown below:

Column 8, line 48 - after "lines" insert -- , --

Column 9, line 25 - delete "FIG. 21" insert -- FIG. 31 -- line 28 - delete "in that" (second occurrence)

line 38 - after "279" insert -- as -- line 57 - delete "depicated" insert -- depicted --

Column 10, line 45 - delete "depicated" insert -- depicted --

Column 11, line 58 - delete "depicting" insert -- depicted --

Column 12, line 11 - delete "214" insert -- 215 -- line 25 - delete "nowever" insert -- however --

Column 13, line 51 - "dluctuate" insert -- fluctuate --

UNITED STATES PATENT AND TRADEMARK OFFICE
CERTIFICATE OF CORRECTION

PATENT NO. : 4,093,919
DATED : June 6, 1978
INVENTOR(S) : Hiroshi WATANABE

It is certified that error appears in the above-identified patent and that said Letters Patent are hereby corrected as shown below:

Column 14, line 1 - after "215" delete "of" insert -- or -- line 12 - after "designated" delete "at" insert -- by --

Column 15, line 17 - before "242" delete "and" insert -- or -- line 67 - delete "os" insert -- so --

Column 16, line 27 - delete "forth-ninth" insert -- forty-ninth -- line 64 - delete "biassing" insert -- biasing --

Column 17, line 10 - delete "96 thru 95" insert -- 92 thru 95 -- line 16 - delete "biassed" insert -- biased --

UNITED STATES PATENT AND TRADEMARK OFFICE
CERTIFICATE OF CORRECTION

PATENT NO. : 4,093,919

DATED : June 6, 1978

INVENTOR(S) : Hiroshi WATANABE

It is certified that error appears in the above-identified patent and that said Letters Patent are hereby corrected as shown below:

IN THE CLAIMS:

Column 18, line 6 - after "circuit" insert -- ; -- line 30 - delete "signle" insert -- single -- line 46 - delete "circuit" insert -- circuits --

Column 20, line 33 - after "combiner" insert -- ; -- line 63 - delete "siad" insert -- said --

Column 21, line 14 - delete "improviment" insert -- improvement --

Column 22, line 23 - delete "meamns" insert -- means --

Signed and Sealed this

Twenty-fourth Day of April 1979

[SEAL]

Attest:

RUTH C. MASON
Attesting Officer

DONALD W. BANNER
Commissioner of Patents and Trademarks